(12) United States Patent
Yang

(10) Patent No.: US 9,466,610 B1
(45) Date of Patent: Oct. 11, 2016

(54) METHOD OF FABRICATING THREE-DIMENSIONAL GATE-ALL-AROUND VERTICAL GATE STRUCTURES AND SEMICONDUCTOR DEVICES, AND THREE-DIMENSIONAL GATE-ALL-ROUND VERTICAL GATE STRUCTURES AND SEMICONDUCTOR DEVICES THEREOF

(71) Applicant: MACRONIX INTERNATIONAL CO., LTD., Hsinchu (TW)

(72) Inventor: Ta-Hone Yang, Miaoli County (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 30 days.

(21) Appl. No.: 14/666,703

(22) Filed: Mar. 24, 2015

(51) Int. Cl.
| | |
|---|---|
| H01L 27/115 | (2006.01) |
| H01L 29/66 | (2006.01) |
| H01L 21/31 | (2006.01) |
| H01L 21/66 | (2006.01) |
| H01L 21/311 | (2006.01) |
| H01L 21/768 | (2006.01) |
| H01L 21/28 | (2006.01) |
| H01L 21/3213 | (2006.01) |
| H01L 29/792 | (2006.01) |
| H01L 29/423 | (2006.01) |
| H01L 23/528 | (2006.01) |

(52) U.S. Cl.
CPC ... *H01L 27/11582* (2013.01); *H01L 21/28282* (2013.01); *H01L 21/31* (2013.01); *H01L 21/31116* (2013.01); *H01L 21/32135* (2013.01); *H01L 21/76802* (2013.01); *H01L 21/76877* (2013.01); *H01L 22/26* (2013.01); *H01L 23/528* (2013.01); *H01L 27/11565* (2013.01); *H01L 27/11568* (2013.01); *H01L 29/4234* (2013.01); *H01L 29/66833* (2013.01); *H01L 29/7926* (2013.01)

(58) Field of Classification Search
CPC .................. H01L 27/11551; H01L 27/11578; H01L 27/11582; H01L 27/11556
See application file for complete search history.

(56) References Cited

U.S. PATENT DOCUMENTS 8,344,385 B2 * 1/2013 Kim .................. H01L 27/11582
257/326

(Continued)

*Primary Examiner* — Ha Tran T Nguyen
*Assistant Examiner* — Aaron Dehne
(74) *Attorney, Agent, or Firm* — Baker & McKenzie LLP

(57) ABSTRACT

Present example embodiments relate generally to methods of fabricating a three-dimensional gate-all-around (GAA) vertical gate (VG) semiconductor structure comprising providing a substrate; forming a plurality of layers having alternating first insulative material layers and second insulative material layers over the substrate; identifying bit line and word line locations for the formation of bit lines and word lines; removing at least a portion of the plurality of layers outside of the identified bit line and word line locations, each of the removed portions extending through the plurality of layers to at least a top surface of the substrate; forming a vertical first insulative material structure in the removed portions; performing an isotropic etching process to remove the second insulative material from the second insulative material layers; forming bit lines in the second insulative material layers within the identified bit line locations; and forming word lines in the identified word line locations.

23 Claims, 21 Drawing Sheets

(56) References Cited

U.S. PATENT DOCUMENTS

| | | | |
|---|---|---|---|
| 2012/0181684 A1* | 7/2012 | Lue | H01L 27/11578 257/734 |
| 2012/0182806 A1* | 7/2012 | Chen | H01L 27/11573 365/185.17 |
| 2013/0051150 A1* | 2/2013 | Roizin | H01L 29/7926 365/185.18 |
| 2013/0153979 A1* | 6/2013 | Noh | H01L 27/11582 257/314 |
| 2016/0163728 A1* | 6/2016 | Tsutsumi | H01L 27/11582 257/66 |

* cited by examiner

METHOD OF FABRICATING THREE-DIMENSIONAL GATE-ALL-AROUND VERTICAL GATE STRUCTURES AND SEMICONDUCTOR DEVICES, AND THREE-DIMENSIONAL GATE-ALL-ROUND VERTICAL GATE STRUCTURES AND SEMICONDUCTOR DEVICES THEREOF

BACKGROUND

The present disclosure relates generally to semiconductor devices, and more specifically, relates to semiconductor structures and devices, including three-dimensional (3D) gate-all-around (GAA) vertical gate (VG) structures in semiconductor devices and semiconductor devices thereof, and methods of fabricating such semiconductor structures and devices.

There is an ever growing need by semiconductor device manufacturers to further shrink the critical dimensions of semiconductor structures and devices, to achieve greater storage capacity in smaller areas, and to do so at lower costs per bit. Three-dimensional (3D) semiconductor devices using, for example, thin film transistor (TFT) techniques, charge trapping memory techniques, and cross-point array techniques, have been increasingly applied to address the above needs. Recent developments in semiconductor technology have included the fabrication of vertical structures in semiconductor devices in the form of 3D vertical channel (VC) structures and 3D vertical gate (VG) structures.

BRIEF SUMMARY

Despite recent developments in the fabrication of semiconductor devices, it is recognized in the present disclosure that one or more problems may be encountered in fabricated three-dimensional (3D) semiconductor devices. For example, the formation of the various layers and structures of 3D vertical channel (VC) structures generally requires a relatively large footprint (or area). Furthermore, such fabricated 3D VC structures often encounter reliability problems and undesirable variations in performance. In respect to 3D vertical gate (VG) structures, although 3D VG structures generally require smaller footprints (or areas) in comparison to 3D VC structures and other fabricated semiconductor devices, the reliable fabrication, including patterning and etching of the vertical gates of such devices and fabricating such devices free of deformation, defects, and/or bending, is oftentimes difficult to achieve.

Present example embodiments relate generally to semiconductor devices and methods of fabricating semiconductor devices that address one or more problems in fabricated semiconductor devices, including those described above and in the present disclosure.

In an exemplary embodiment, a method of fabricating a three-dimensional gate-all-around (GAA) vertical gate (VG) semiconductor structure. The method comprises providing a substrate and forming a plurality of layers over the substrate. The plurality of layers have alternating first insulative material layers and second insulative material layers. The first and second insulative material layers may be formed by a deposition of first insulative material and second insulative material, respectively. The method further comprises identifying bit line and word line locations for the formation of bit lines and word lines. The method further comprises removing at least a portion of the plurality of layers outside of the identified bit line and word line locations, each of the removed portions extending through the plurality of layers to at least a top surface of the substrate. The method further comprises forming a vertical first insulative material structure in the removed portions. The method further comprises performing an isotropic etching process to remove the second insulative material from the second insulative material layers. The method further comprises forming bit lines in the second insulative material layers within the identified bit line locations. The method further comprises forming word lines in the identified word line locations. The vertical first insulative material structures may be operable to provide support for the first insulative material layers remaining after the removing of the second insulative material from the second insulative material layers.

In another exemplary embodiment, a semiconductor structure is described in the present disclosure. The semiconductor structure comprises a three-dimensional gate-all-around (GAA) vertical gate (VG) structure having bit lines and word lines formed over a substrate. The semiconductor structure further comprises a plurality of elongated posts extending from at least a top surface of the substrate. The plurality of elongated posts may be formed adjacent to the three-dimensional vertical gate structure. The plurality of elongated posts may be operable to provide support for the three-dimensional vertical gate structure.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and.

Example embodiments will now be described with reference to the accompanying drawings, which form a part of the present disclosure, and which illustrate example embodiments which may be practiced. As used in the present disclosure and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used in the present disclosure and the appended claims is for the purpose of describing example embodiments only and is not intended to be limitations. In this respect, as used in the present disclosure and the appended claims, the term "in" may include "in" and "on," and the terms "a," "an" and "the" may include singular and plural references. Furthermore, as used in the present disclosure and the appended claims, the term "by" may also mean "from," depending on the context. Furthermore, as used in the present disclosure and the appended claims, the term "if" may also mean "when" or "upon," depending on the context. Furthermore, as used in the present disclosure and the appended claims, the words "and/or" may refer to and encompass any and all possible combinations of one or more of the associated listed items.

DETAILED DESCRIPTION

Despite recent developments in the fabrication of semiconductor devices, it is recognized in the present disclosure that one or more problems may be encountered in the fabrication of three-dimensional (3D) semiconductor devices, and in the fabricated three-dimensional (3D) semiconductor devices themselves.

Figure 1A:
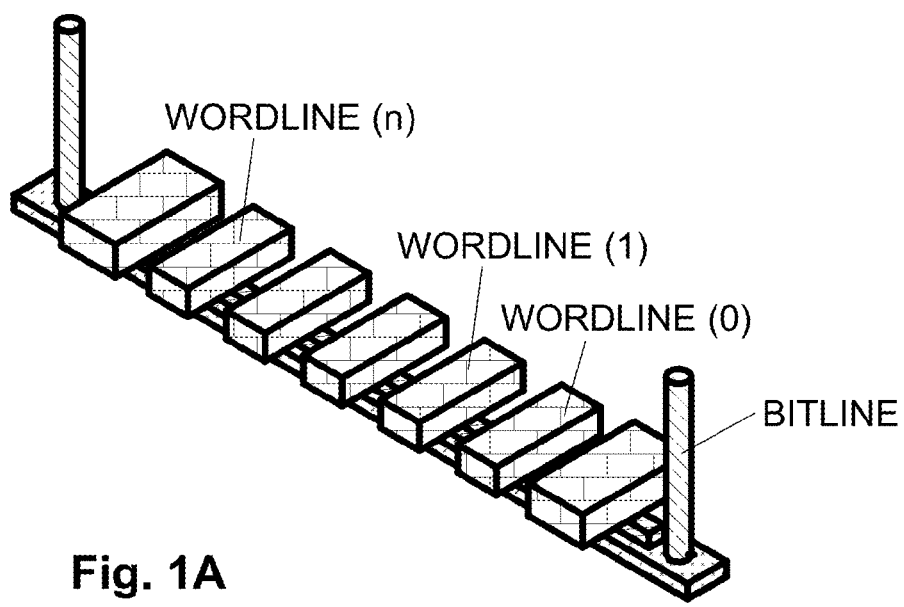
FIG. 1A is an example illustration of a two-dimensional horizontal channel device.
Figure 1B:
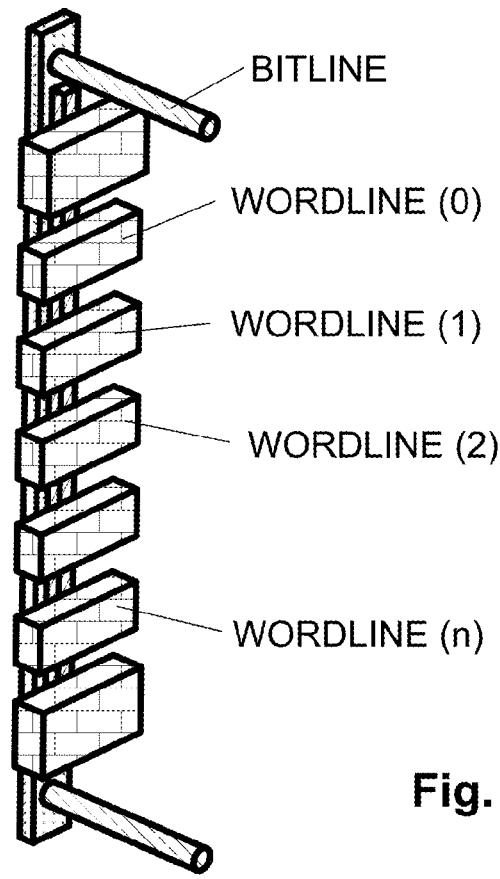
FIGS. 1B and 1C are example conceptual illustrations of re-configuring a two-dimensional horizontal channel device to vertically extend the gates.
Figure 1C:
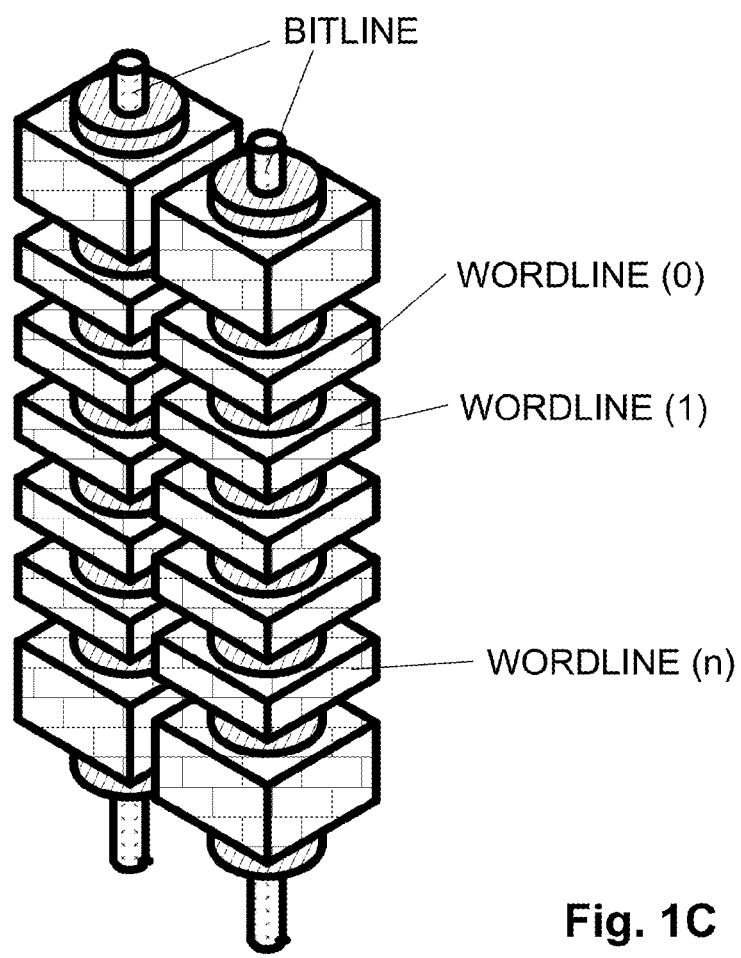

FIGS. 1A-C provide an example conceptual illustration of how a two-dimensional (2D) horizontal channel device relates to a 3D vertical channel (VC) device. As illustrated in FIGS. 1A-C, fabrication of a 3D VC device may conceptually be seen as first re-orienting a 2D horizontal channel device (FIG. 1A) from a horizontal orientation to a vertical orientation (FIG. 1B) and forming bit lines and word lines. In respect to 3D VC structures, the formation of the various layers and structures of the 3D VC structures generally requires a relatively large footprint (or area). Furthermore, such 3D VC structures often encounter problems pertaining to reliability and undesirable variations in performance, as well as deformations, defects, and/or bending of the vertical structures.

Figure 2A:
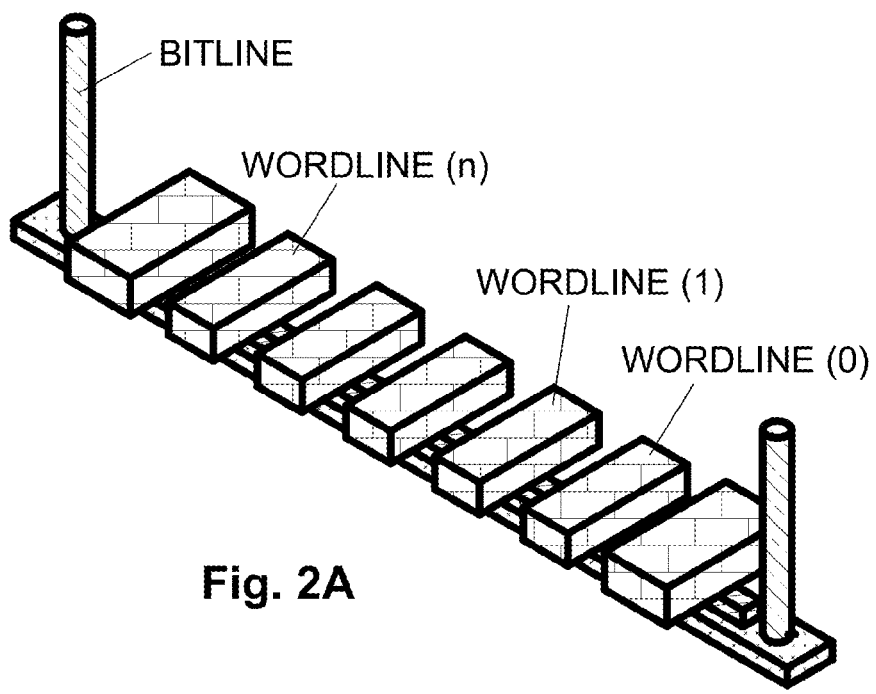
FIGS. 2A-C are example illustrations of a three-dimensional vertical gate device.
Figure 2B:
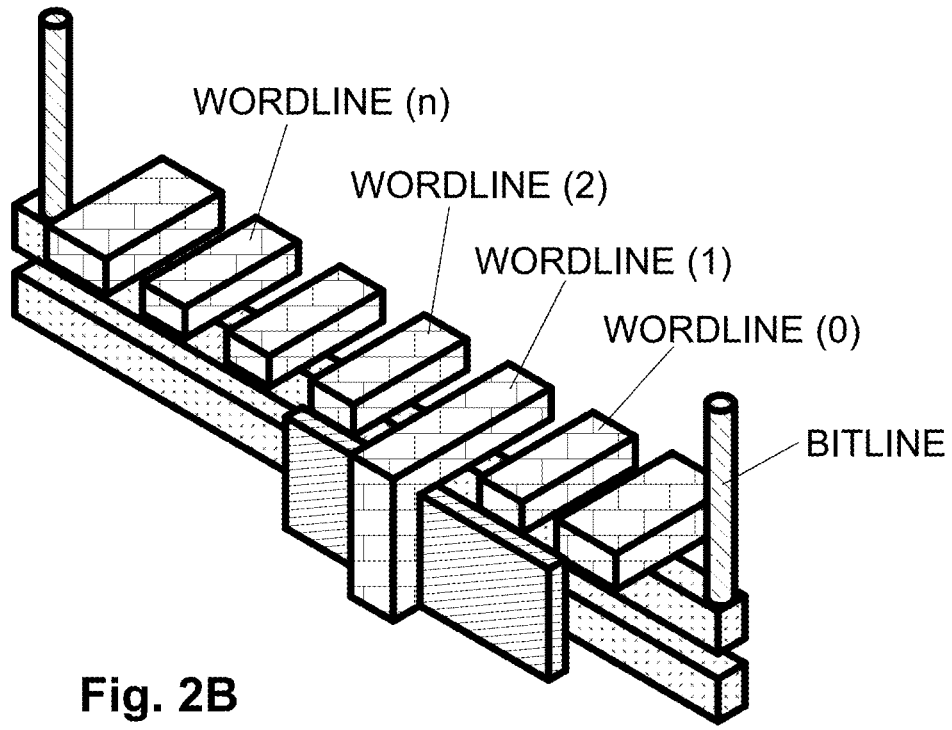
Figure 2C:
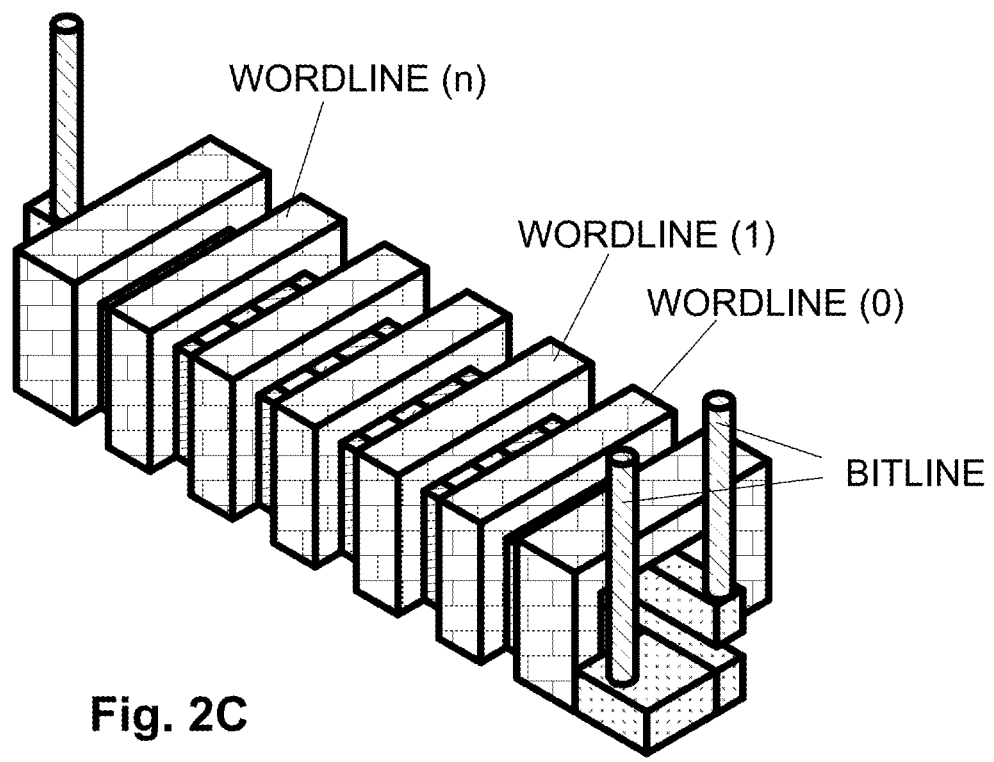
Figure 3A:
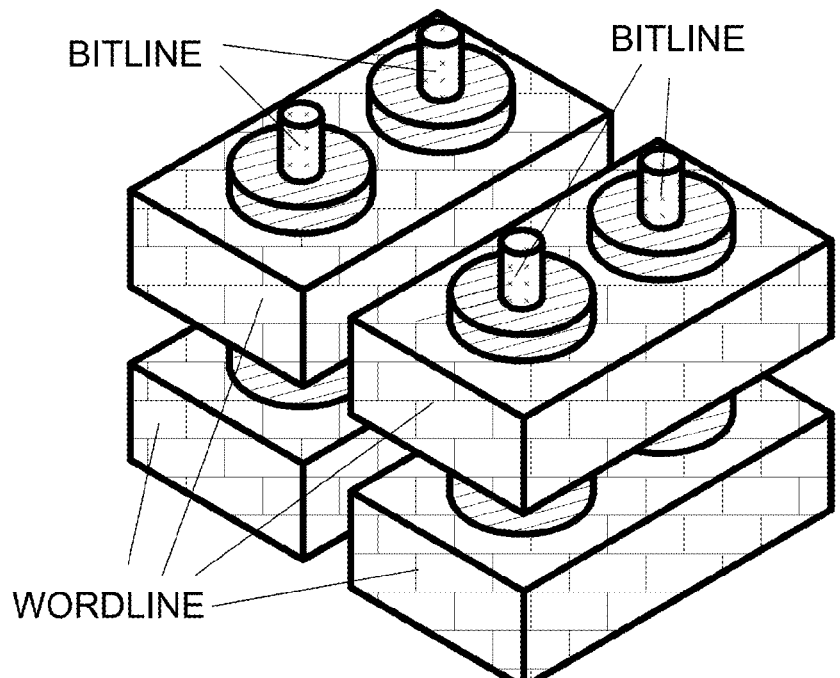
FIG. 3A is an example conceptual illustration of a footprint required for a three-dimensional vertical channel device.
Figure 3B:
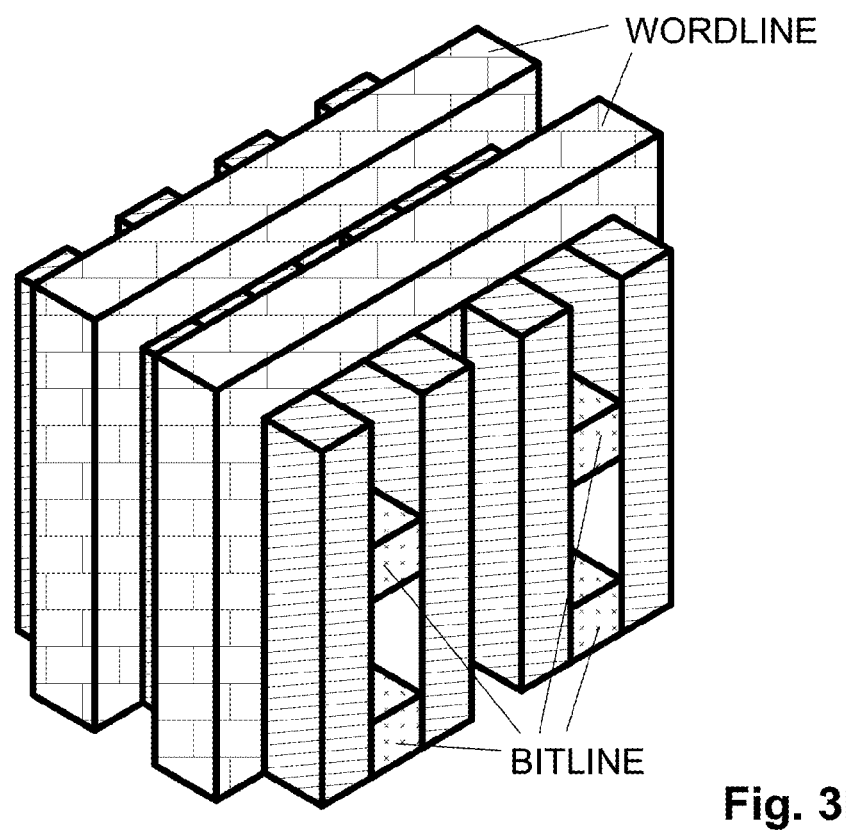
FIG. 3B is an example conceptual illustration of a footprint required for a three-dimensional vertical gate device.

Recent developments have led to the introduction and development of 3D vertical gate (VG) structures. In general, a 3D VG structure requires relatively smaller footprints (or areas), as compared to 3D VC structures. FIGS. 2A-C provide an example conceptual illustration of how a 2D horizontal channel device relates to a 3D VG structure. As illustrated in FIGS. 2A and 2B, a 2D horizontal channel device (FIG. 2A) may be conceptually re-configured (FIGS. 2B and 2C) so as to vertically extend the gates. As shown in the comparative examples of FIGS. 3A-B, whereas a 3D VC device (conceptually illustrated in FIG. 3A) requires a footprint spanning along two axes (illustrated as X and Y axes), a 3D VG device (conceptually illustrated in FIG. 3B) merely occupies a footprint spanning along only one axis (illustrated as X axis).

Although 3D VG structures generally achieve smaller footprints as compared to 3D VC structures, semiconductor manufacturers oftentimes encounter difficulty in reliably fabricating 3D VG structures, including achieving reliable patterning and etching of the vertical gates of such devices and fabricating such devices free of deformations, defects, and/or bending of the vertical structures thereof. For example, due to the high aspect ratio requirements in such semiconductor devices, etching (especially near the bottom layers of the structures) is generally difficult to perform and oftentimes results in undesirable portions (hereinafter called "stringers") to remain and/or form along the sidewall(s) and/or bottom portions of the semiconductor devices. Such stringers, when undesirably formed, may cause, among other things, bridging effects between layers and/or structures, such as between consecutive word lines, and may result in undesirable paths and/or leakage in the fabricated semiconductor device.

Figure 4:
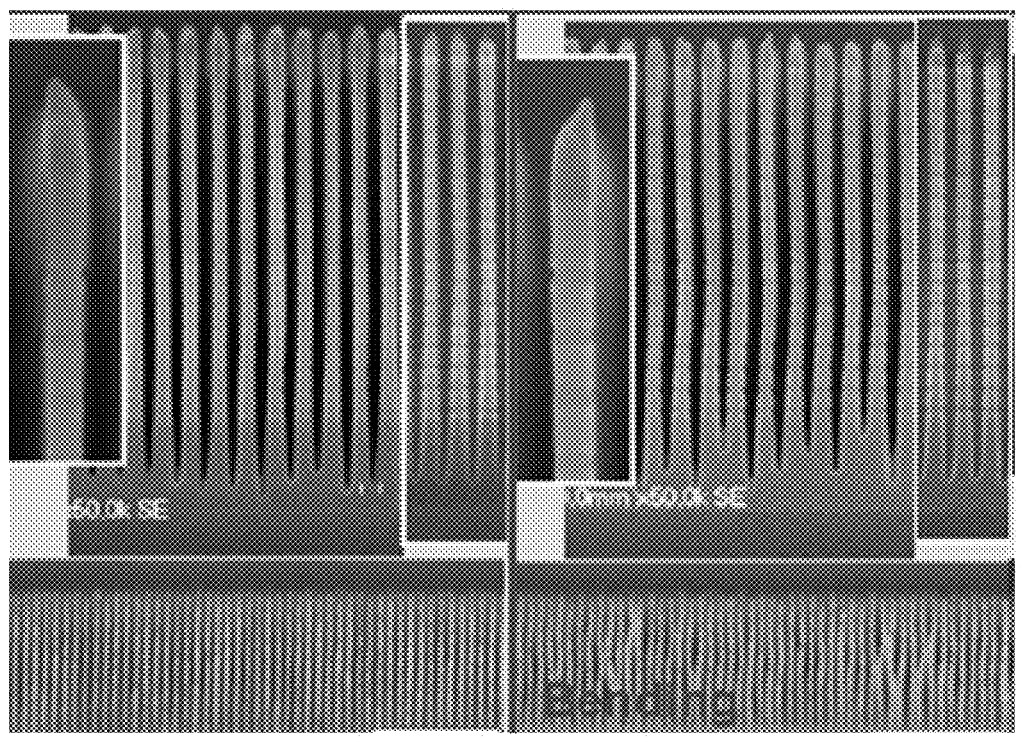
FIG. 4 is an example image illustrating a distortion, deformation, and/or bending of portions of vertical structures in three-dimensional devices.
Figure 5:
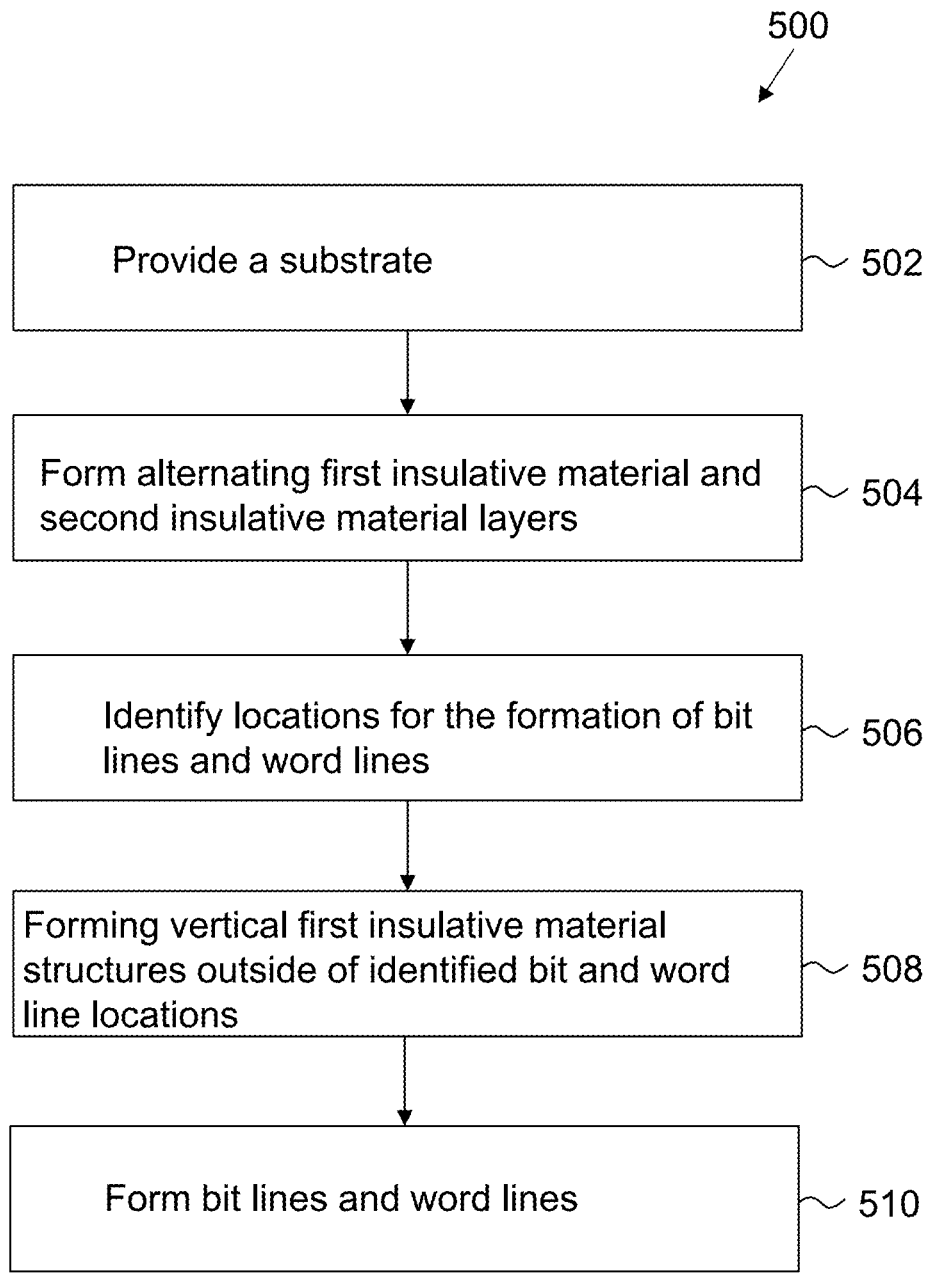
FIG. 5 is an example embodiment of a method of fabricating a three dimensional semiconductor device.

Another problem encountered in the fabrication of 3D vertical structures, such as 3D VC structures and 3D VG structures, pertains to the oftentimes encountered deformation, distortion, and/or bending in one or more portions of one or more vertical structures during fabrication and in the fabricated 3D VG semiconductor device. FIG. 4 illustrates an example of such a problem occurring in vertical structures of 3D VG structures.

Semiconductor devices and structures, including three-dimensional (3D) gate-all-around (GAA) vertical gate (VG) devices and structures, and methods of fabricating such semiconductor devices and structures are described in the present disclosure for addressing one or more problems encountered in semiconductor devices and structures, including those described above and herein. It is to be understood in the present disclosure that the principles described herein can be applied outside the context of NAND-type and NOR-type devices, including floating gate memory devices, charge trapping memory devices, non-volatile memory devices, and/or embedded memory devices.

Example embodiments of methods for fabricating example embodiments of semiconductor devices, such as 3D GAA VG structures, are depicted in FIGS. 5-10. As illustrated in the sequence of actions of FIG. 5, an example embodiment of a method 500 may include providing a substrate at action 502. An example embodiment of a method 500 may further include forming a plurality of alternating first insulative material and second insulative material layers over the substrate at action 504. Each of the first insulative material layers and second insulative material layers may be formed by a deposition of first insulative material and second insulative material, respectively. A cross-sectional view of an example embodiment of alternating first insulative material layers 604 and second insulative material layers 606 formed over a substrate 602 is illustrated in FIG. 6A. The first insulative materials may include oxides, and the like, and the second insulative materials may include nitrides, and the like.

An example embodiment of a method 500 may further include identifying bit line and word line locations for the formation of bit lines and word lines at action 506. A top view of an example embodiment of identifying bit line 608 and word line 610 locations is illustrated in FIG. 6B.

The method 500 may further include forming one or more vertical first insulative material structures outside of the identified bit line locations and identified word line locations at action 508. An example of such a location is depicted as an "X" in FIG. 6B.

An example embodiment of a method 500 may further include forming a 3D GAA VG structure, including bit lines and word lines, at action 510. Example embodiments of a 3D GAA VG semiconductor device and/or structure comprising bit lines 608, word lines 610, and vertical insulative material structures 612 are illustrated in at least FIGS. 7-8. It is recognized in the present disclosure that present example embodiments, including one or more vertical insulative material structures formed on one or both sides of vertical structures of a semiconductor device, are operable to prevent and/or significantly eliminate the occurrence of deformation, distortion, and/or bending in the vertical structures of the semiconductor device, as well as the formation of stringers. In other words, the elongated posts may be operable to provide support for and prevention of the formation of stringers in or on the vertical structures of the semiconductor device so as to prevent such undesirable problems from occurring during fabrication of the semiconductor device and/or in the finished semiconductor device product. Furthermore, example embodiments of the vertical insulative material structures may provide reductions in or absence of the occurrences of stringers and/or deformities, defects, and/or bending of the vertical structures in the semiconductor devices.

Example embodiments of a semiconductor device, such as a 3D VG device, may be fabricated according to one or more of the above actions, may also include additional actions, may be performable in different sequences, and/or one or more of the actions may be combinable into a single action or divided into two or more actions. Semiconductor devices other than NAND-type and NOR-type devices are also contemplated in example embodiments without departing from the teachings of the present disclosure. These actions and semiconductor devices will now be described with references to FIGS. 5-10.

(1) Providing a Substrate (e.g., Action 502).

Substrates 602 appropriate for use in semiconductor devices and structures may be obtained by any one or more manufacturing methods, such as pressing methods, float methods, down-drawn methods, redrawing methods, fusion methods, and/or the like.

(2) Forming a Plurality of Alternating First Insulative Material Layers and Second Insulative Material Layers (e.g., Action 504).

Figure 6A:
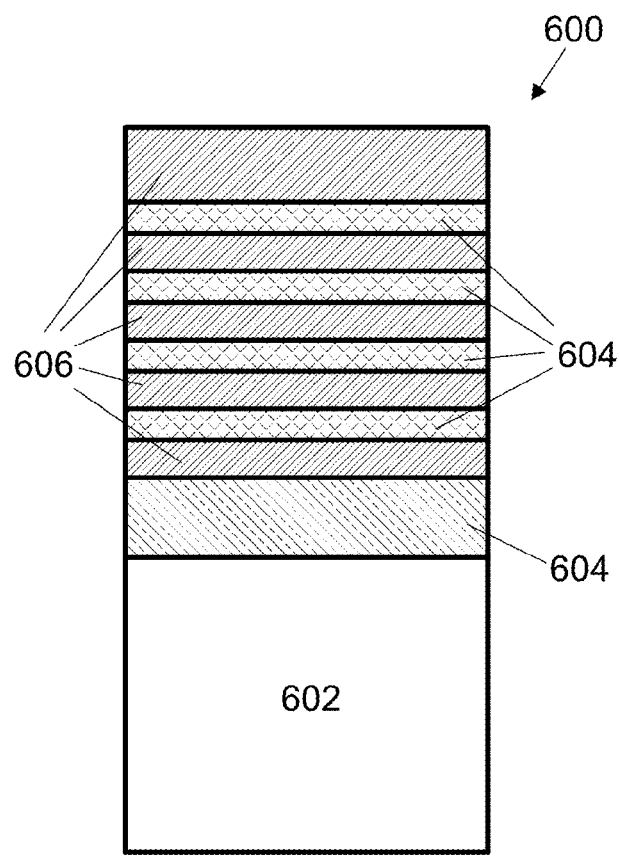
FIG. 6A is a cross-sectional view of an example embodiment of alternating insulative material layers and conductive material layers formed over a substrate.
Figure 6B:
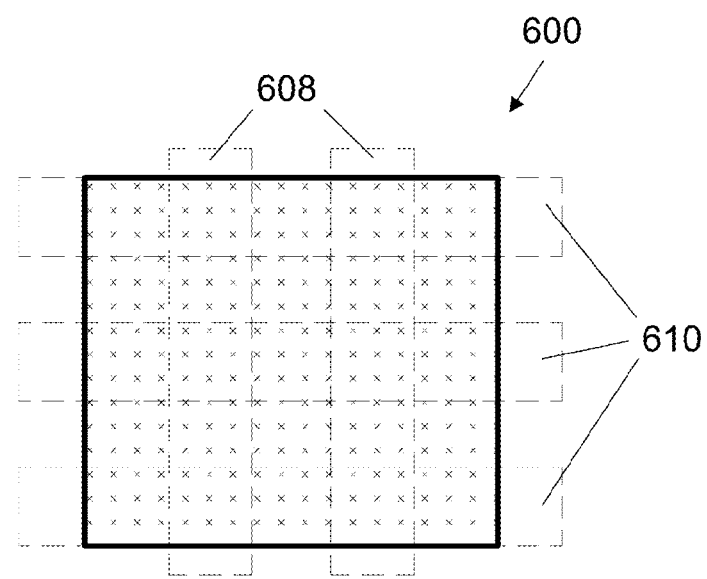
FIG. 6B is a top view of an example embodiment of identifying bit line and word line locations.

A substrate 602, such as one obtained from the above action 502, may be provided with alternating first insulative material layers 604 and second insulative material layers 606 thereon (e.g., action 504), as illustrated in the cross-sectional view of FIG. 6A. The first insulative materials may include oxides, and the like, and the second insulative materials may include other insulative or dielectric materials that are different from the first insulative materials, such as nitrides, or the like. The thickness of each of the first insulative material layers 604 may be about 200 nm. The first insulative material and the second insulative material may be selected in such a way as to allow removal (such as etching) of the first insulative material without removing the second insulative material, and vice versa. It is recognized herein that the thickness of each of the first insulative material layers 604 may be about 100-300 nm in example embodiments. The thickness of each of the second insulative material layers 606 may be about 600 nm. It is recognized herein that the thickness of each of the second insulative material layers 606 may be about 500-700 nm in example embodiments.

(3) Identifying Word Line and Bit Line Locations (e.g., Action 506).

A substrate 602 having alternating first insulative material layers 604 and second insulative material layers 606 formed thereon may be subjected to an identification (or planning or designing) process whereby bit line locations 608 and word line 610 locations are identified (or planned or designed) for subsequent actions (as described below and herein), including the forming of bit lines 608, word lines 610, and vertical first insulative material structures 612. An example identification of bit line 608 and word line 610 locations is illustrated in the top view illustration of FIG. 6B.

(4) Forming 3D GAA VG Structures, Including Bit Lines, Word Lines, and Vertical Insulative Material Structures (e.g., Actions 508 and 510).

The formation of 3D GAA VG structures, including bit lines 608, word lines 610, and vertical insulative material structures 612, may be performed in one or more of a plurality of ways in example embodiments. FIGS. 7-10 provide illustrations of example actions that may be employed for the fabrication of example embodiments of 3D GAA VG semiconductor devices and structures. These example embodiments are now described below.

First Example Embodiment

FIG. 7-9 provide illustrations of example actions for fabricating example embodiments of 3D GAA VG semiconductor devices having vertical insulative material structures 612.

Figure 9A:
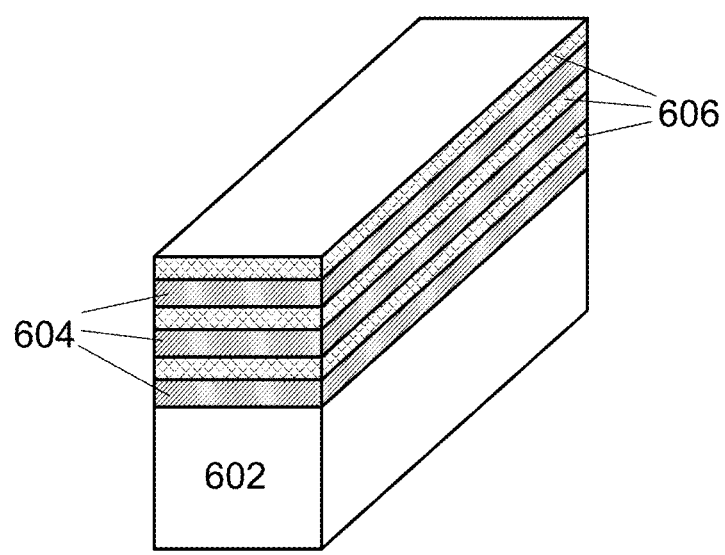
FIGS. 9A-K are illustrative views of an example embodiment of a method of fabricating an example embodiment of a semiconductor device.

As illustrated in the perspective view illustration of FIG. 9A, a substrate 602 may be provided with alternating first insulative material layers 604 and second insulative material layers 606 thereon (e.g., action 504). The first insulative materials may include oxides, and the like, and the second insulative materials may include nitrides, and the like. In an example embodiment, the first insulative material may be any insulative or dielectric material that differs from the second insulative material, and vice versa, that allows an easy removal of either the first or second insulative material without removing the other.

The first insulative material layers 604 may be about 100-300 nm in thickness and the second insulative material layers 606 may be about 500-700 nm in thickness.

Figure 9B:
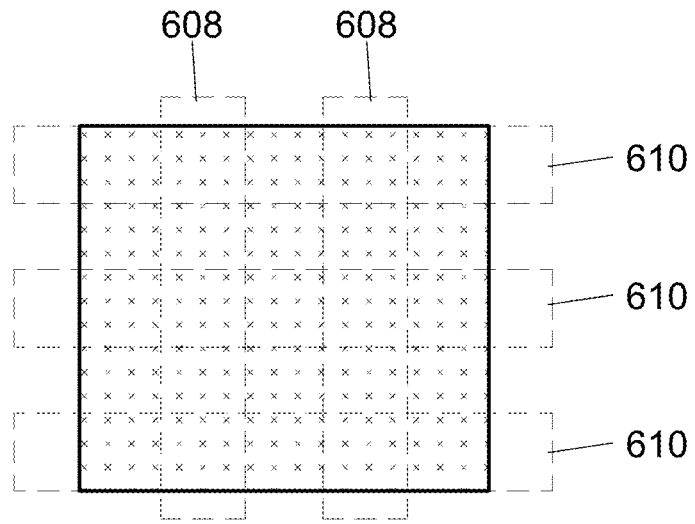

Bit line locations 608 and word line 610 locations may then be identified for the stack (e.g., action 506), as illustrated in the top view illustration of FIG. 9B and FIG. 6B. The bit line pitch may be about 80-160 nm and the word line pitch may be about 80-160 nm in example embodiments.

Figure 9C:
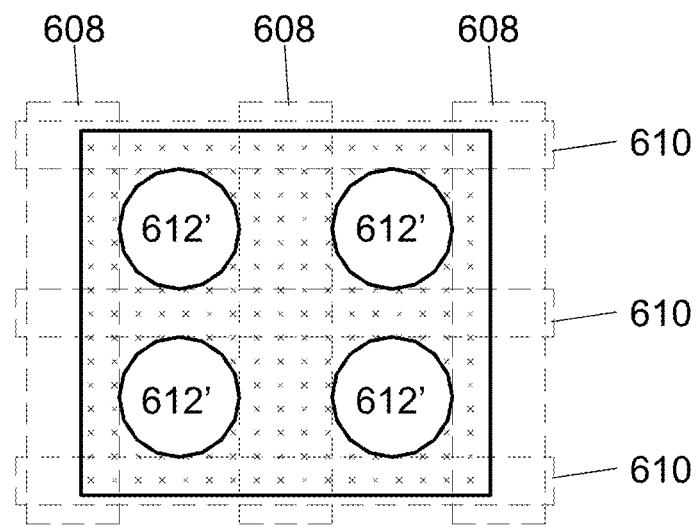

One or more portions of the plurality of alternating first insulative material layers 604 and second insulative material layers 606 may be removed 612' in selected portions (or areas) that are adjacent to the identified bit line locations 608 and identified word line locations 610, such as one or more of the portions 612' illustrated in the top view illustrations of FIG. 9C. Each of the removed portions 612' of the plurality of alternating first insulative material layers 604 and second insulative material layers 606 may be portions extending through the plurality of layers to at least a top surface of the substrate 602. For example, the removed portions 612' may have a diameter of about 5-80 nm. In example embodiments, a portion (or side) of the removed portion 612' may be formed within a portion (or side) of an identified bit line location 608 and/or word line location 610. Furthermore, a cross-section of the removed portions may be one or more of a plurality of shapes, including a circle, oval, square, rectangle, triangle, etc.

Figure 7A:
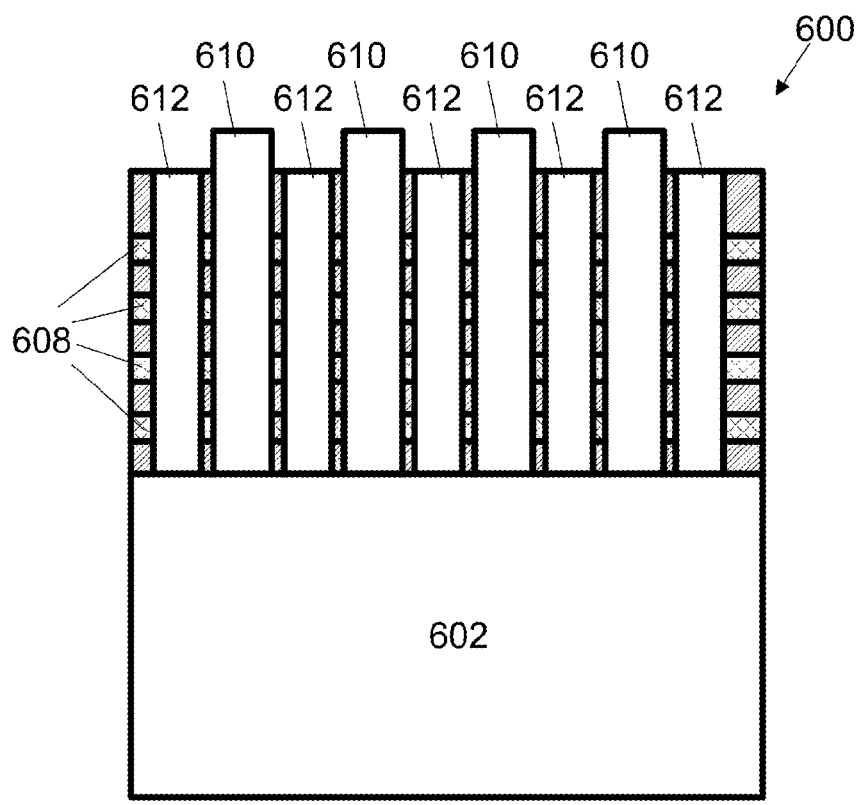
FIG. 7A is a side view of an example embodiment of a semiconductor device.
Figure 7B:
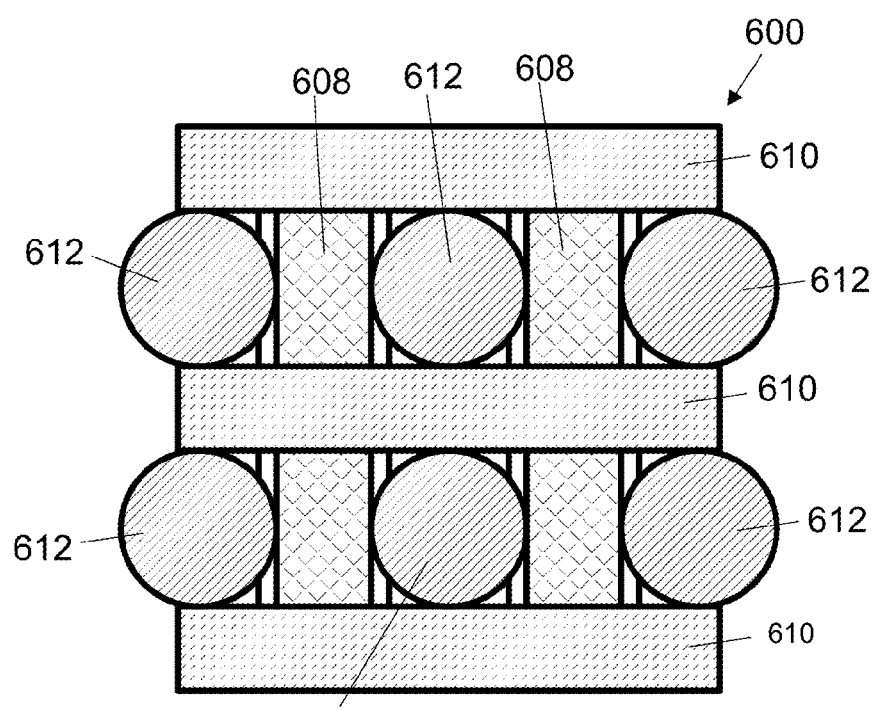
FIG. 7B is a top view of an example embodiment of a semiconductor device.
Figure 7C:
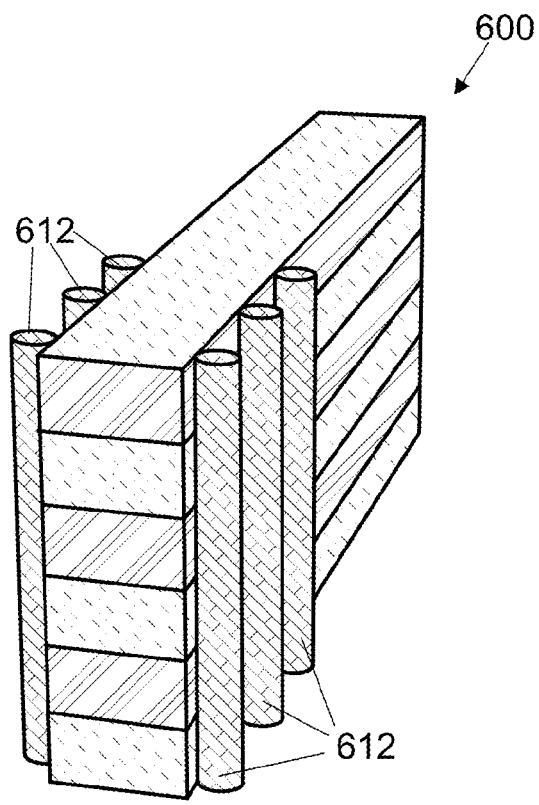
FIG. 7C is a perspective view of an example embodiment of a semiconductor device.
Figure 8A:
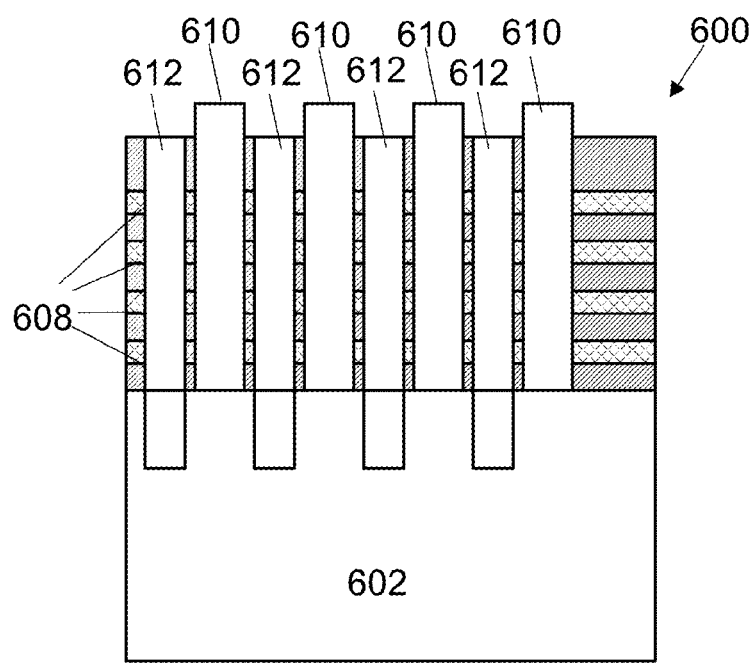
FIG. 8A is a side view of an example embodiment of a semiconductor device.
Figure 8B:
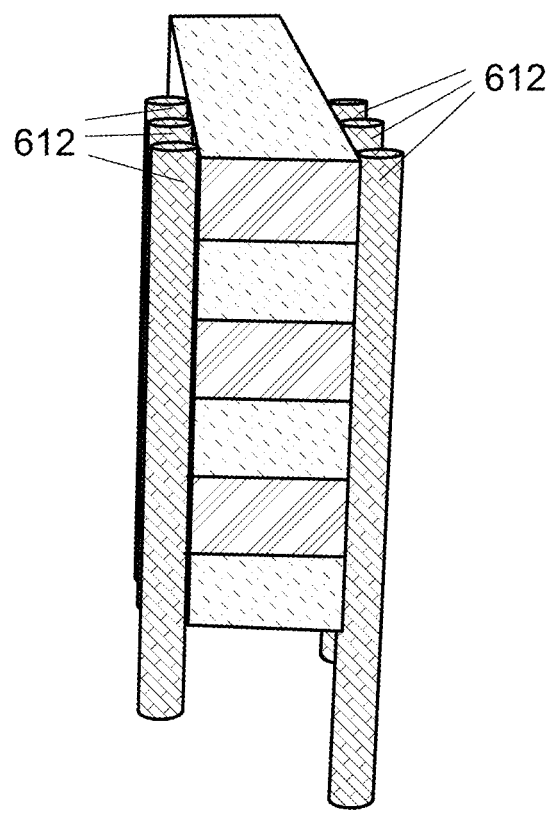
FIG. 8B is a perspective view of an example embodiment of a semiconductor device.

The removed portion 612' may be formed extending from a top surface of the substrate 602, such as in the example embodiments illustrated in FIGS. 7A-C. In such an embodiment, a vertical first insulative material structure 612 later-formed in the removed portion 612' will have a base extending from the top surface of the substrate 602. Alternatively or in addition, some or all of the removed portions 612' may be formed extending from below the top surface of the substrate 602, such as in the example embodiments illustrated in FIGS. 8A-B. In such an embodiment, later-formed vertical first insulative material structures 612 will have a base extending from below the top surface of the substrate 602. For example, the removed portions 612' (and corresponding later-formed vertical first insulative material structures 612) may be formed 120-240 nm below the top surface of the substrate 602. In example embodiments, the removed portions 612' may include areas between each identified word line location 610, areas before the first and/or after the last identified word line location, and/or areas between only some identified word line locations 610.

Figure 9D:
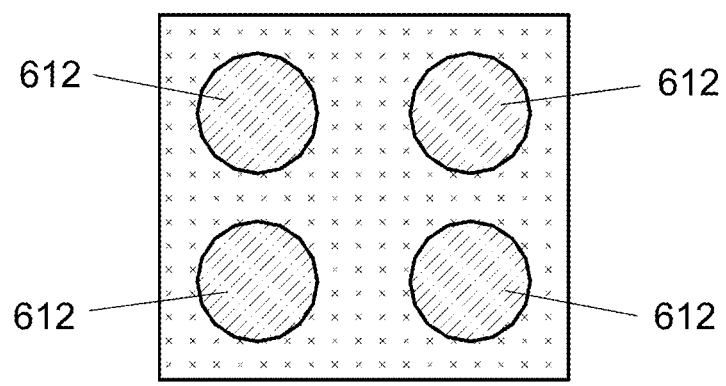

A deposition process may be performed to form vertical first insulative structures 612 in the removed portions 612', as illustrated in the top view illustration of FIG. 9D. In an example embodiment, the removed portions 612' may be filled with first insulative material, such as an oxide, or the like, so as to form vertical first insulative material structures.

Figure 9E:
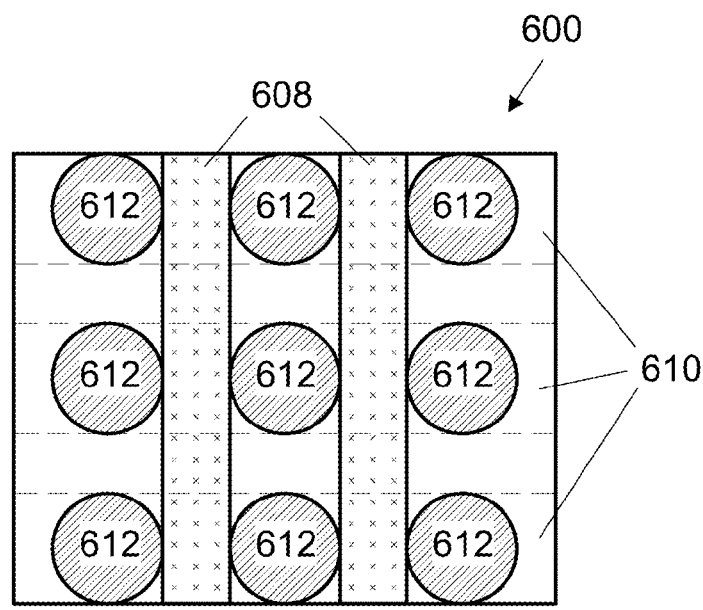

In an example embodiment, portions of the plurality of alternating first insulative material and second insulative material layers remaining outside of the identified bit line locations may be removed, such as by an etching process, as illustrated in FIG. 9E. In this regard, the vertical first insulative material structures 612' remain outside of the identified bit line locations 608 so as to support the remaining bit line structure.

Figure 9F:
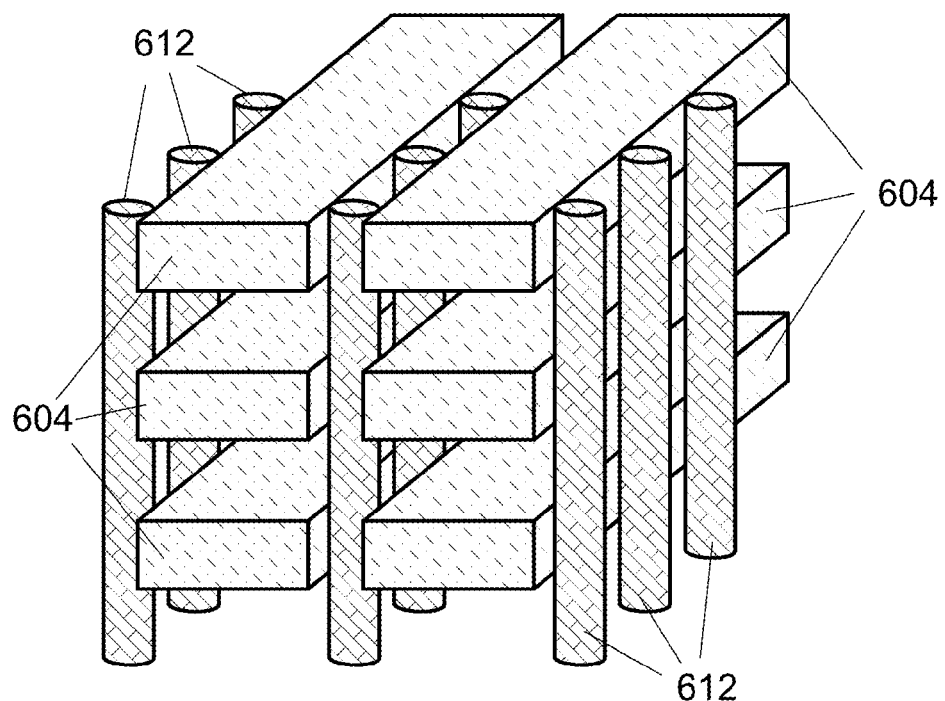

Thereafter, an isotropic etching process may be performed so as to remove the second insulative material from the second insulative material layers 608. Specifically, the second insulative material may be removed from the second insulative material layers 606 in the identified bit line locations 608. In this regard, the remaining first insulative material within the identified bit line locations 608 may be supported and held in place by the vertical first insulative material structures 612, and therefore remain "floating" or "suspended" in place in the first insulative material layers 604, as illustrated in FIG. 9F.

A rounding process may then be performed on the remaining first insulative material layers 604 so as to shape the first insulative material layers 604 into a more rounded cross-section (or more cylindrical in shape).

Figure 9G:
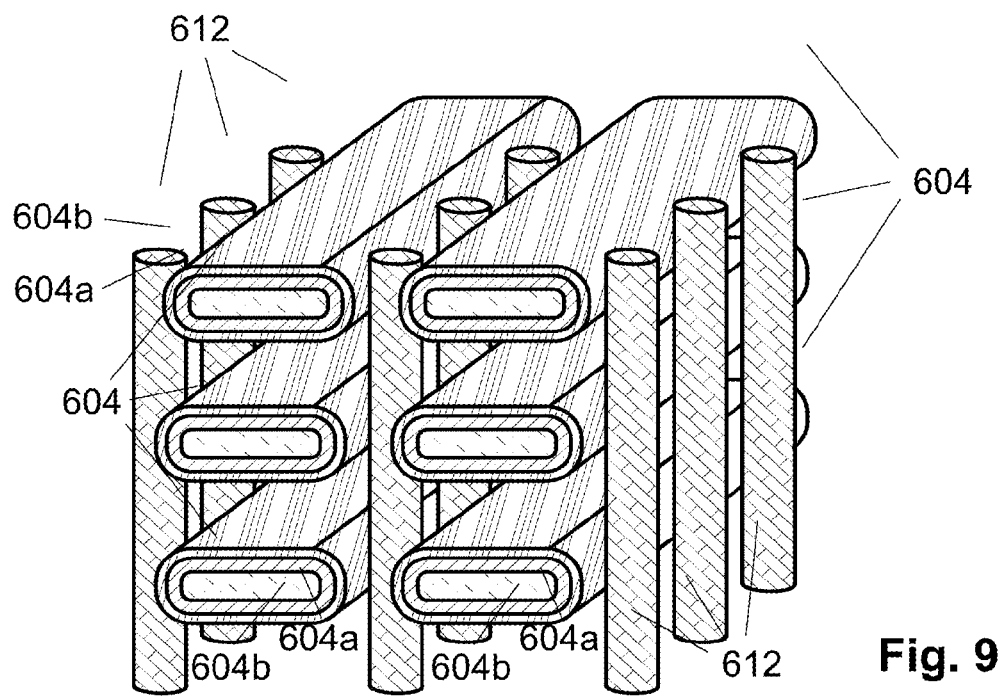

For the rounded first insulative material layers 604', a macaroni deposition process may be performed by first depositing a thin conductive material layer 604a, such as a polysilicon layer, over the rounded first insulative material layers 604'. Thereafter, a charge storage layer 604b may be formed over the conductive material layer 604a, as illustrated in FIG. 9G. In example embodiments, the charge storage layer 604b may be an oxide nitride oxide (ONO) layer 604b.

Figure 9H:
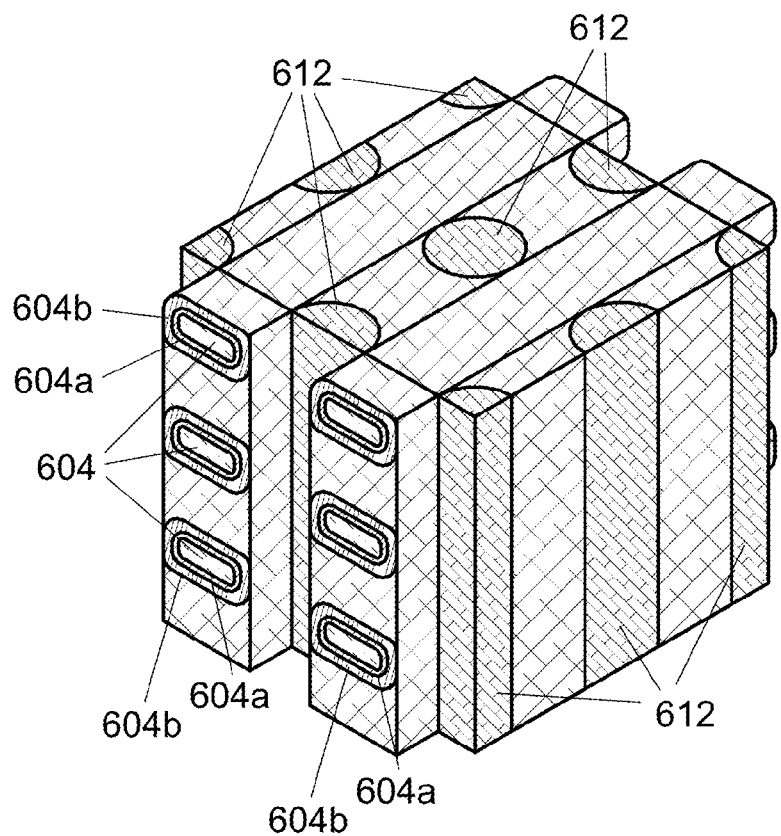

In an example embodiment, a conductive material deposition process may be performed in the identified word line locations 610 outside of the identified bit line locations 608, as illustrated in FIG. 9H. In doing so, it is recognized in the present disclosure that conductive material may also be deposited within the removed second insulative material layers 606 (such as within the identified bit line locations 608 and/or identified word line locations 610).

Figure 9I:
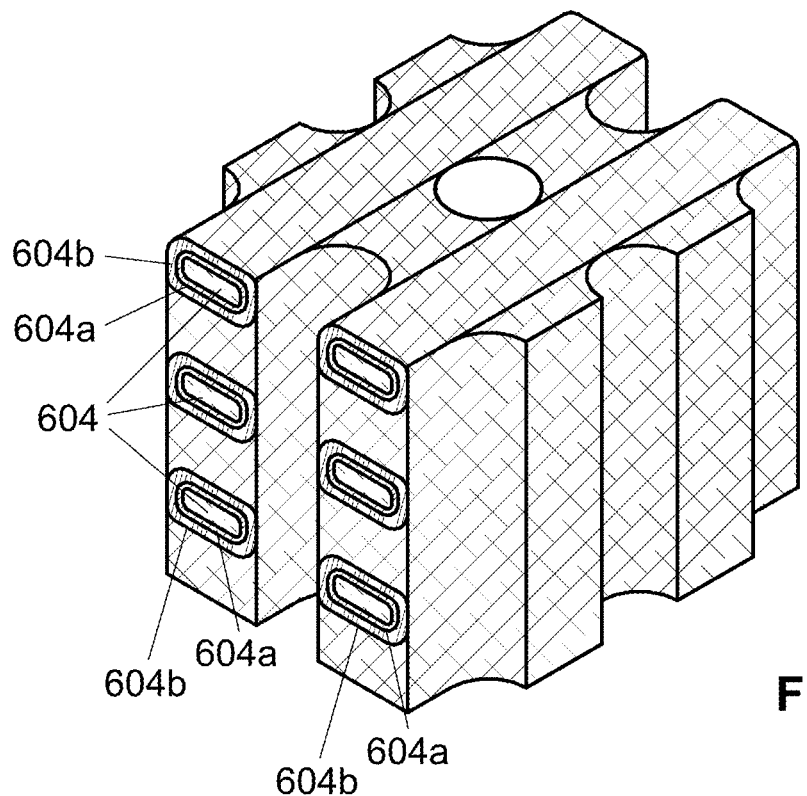
Figure 9J:
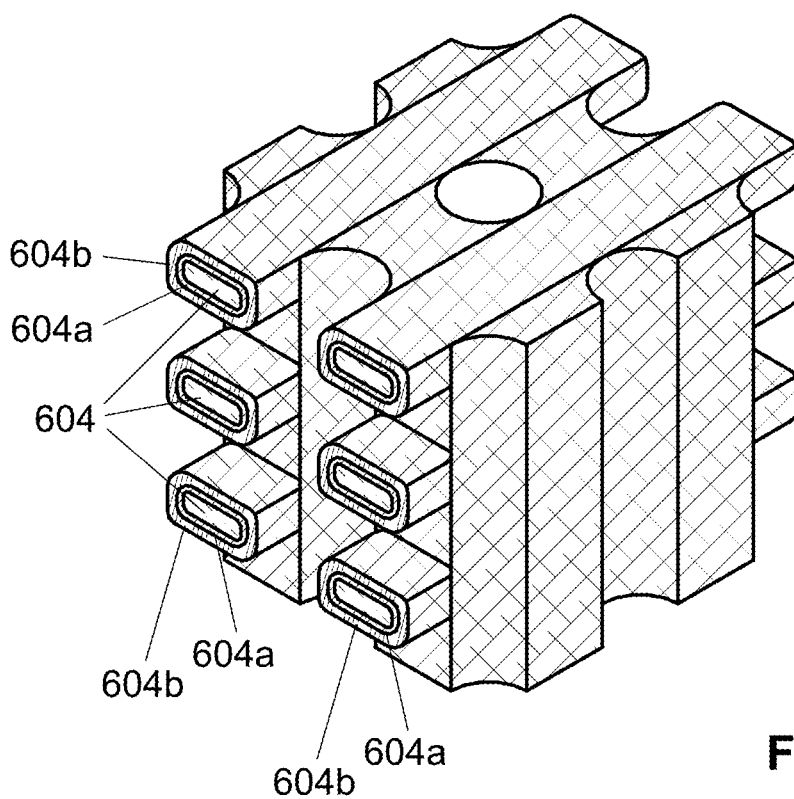

The vertical first insulative material structures 612 may then be removed in example embodiments, as illustrated in FIG. 9I, and an asymmetrical etching process may be performed to remove conductive material deposited within the removed second insulative material layers 606 in areas within the identified bit line locations 608 that are outside of the identified word line locations 610, as illustrated in FIG. 9J.

Figure 9K:
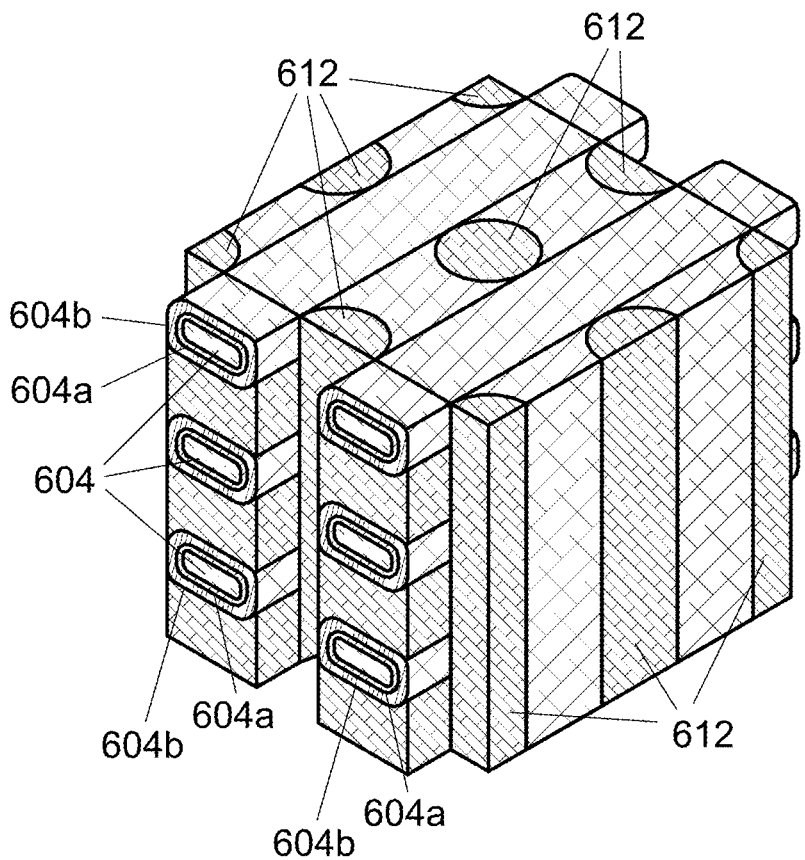

In an example embodiment, as illustrated in FIG. 9K, a first insulative material deposition process may then be performed so as to fill the previously removed portions, including re-forming the vertical first insulative material structures 612. One or more word lines may then be formed for the semiconductor device in the identified word line locations.

Second Example Embodiment

FIGS. 7, 8, and 10 provide illustrations of another set of example actions for fabricating example embodiments of 3D GAA VG semiconductor devices having vertical insulative material structures 612.

Figure 10A:
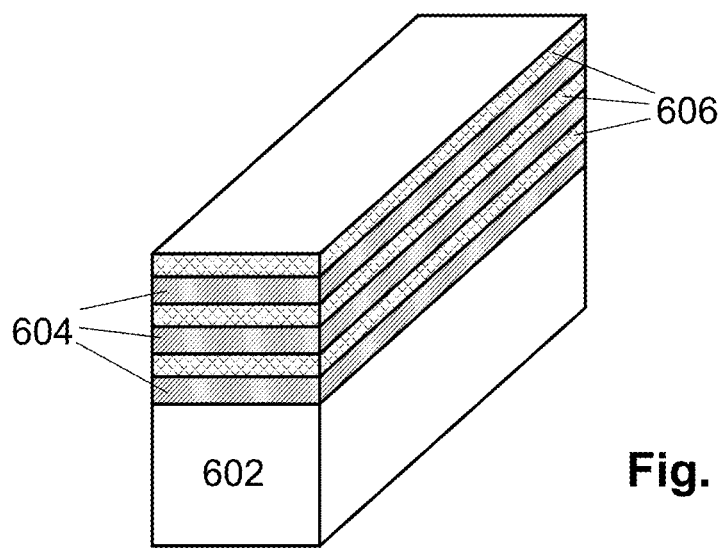
FIGS. 10A-K are illustrative views of another example embodiment of a method of fabricating an example embodiment of a semiconductor device Although similar reference numbers may be used to refer to similar elements in the figures for convenience, it can be appreciated that each of the various example embodiments may be considered to be distinct variations.

As illustrated in the perspective view illustration of FIG. 10A, a substrate 602 may be provided with alternating first insulative material layers 604 and second insulative material layers 606 thereon (e.g., action 504). The first insulative materials may include oxides, and the like, and the second insulative materials may include nitrides, and the like. In an example embodiment, the first insulative material may be any dielectric material that differs from the second insulative material, and vice versa, that allows an easy removal of either the first or second insulative material without removing the other.

The first insulative material layers 604 may be about 100-300 nm in thickness and the second insulative material layers 606 may be about 500-700 nm in thickness.

Figure 10B:
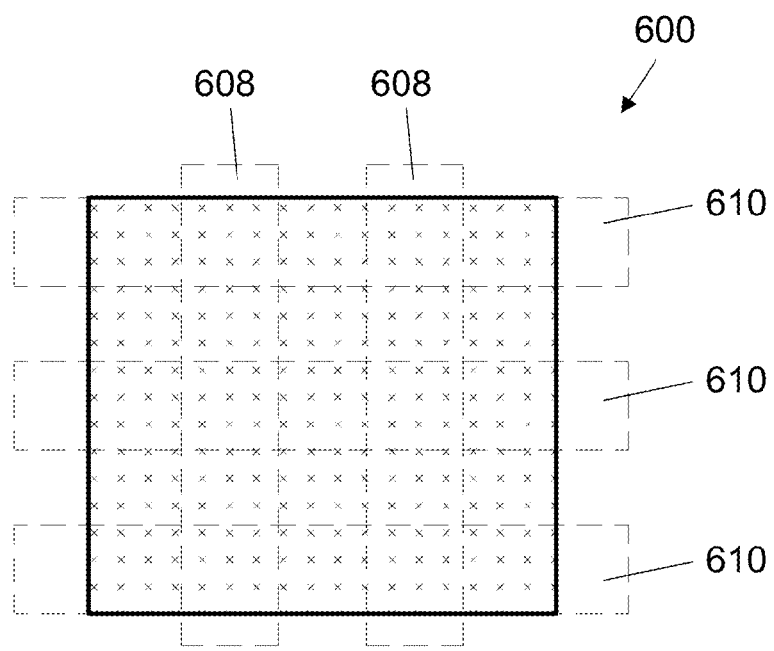

Bit line locations 608 and word line 610 locations may then be identified for the stack (e.g., action 506), as illustrated in the top view illustration of FIG. 10B and FIG. 6B. The bit line pitch may be about 80-160 nm and the word line pitch may be about 80-160 nm in example embodiments.

Figure 10C:
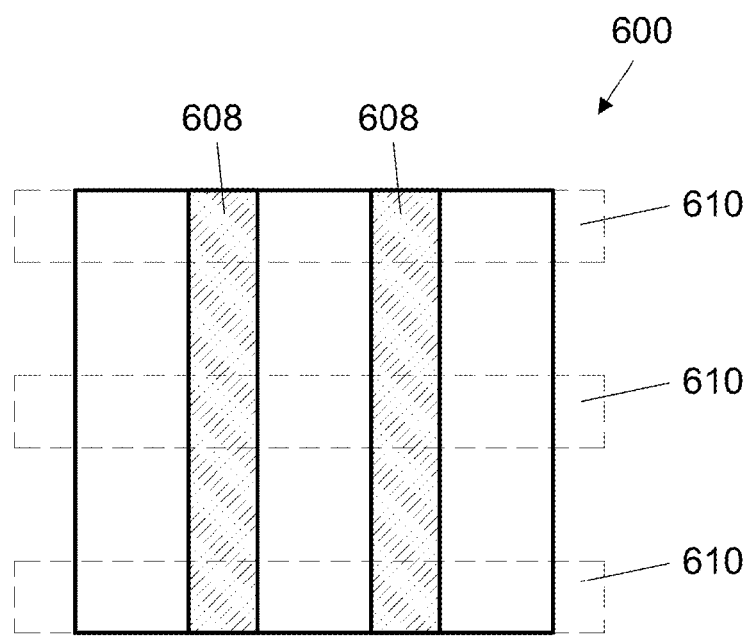

Portions of the plurality of alternating first insulative material layers 604 and second insulative material layers 606 may be removed outside of the identified bit line locations 608, as illustrated in the top view illustration of FIG. 10C. Each of the removed portions of the plurality of alternating first insulative material layers 604 and second insulative material layers 606 may extend through the plurality of layers to at least a top surface of the substrate 602.

Figure 10D:
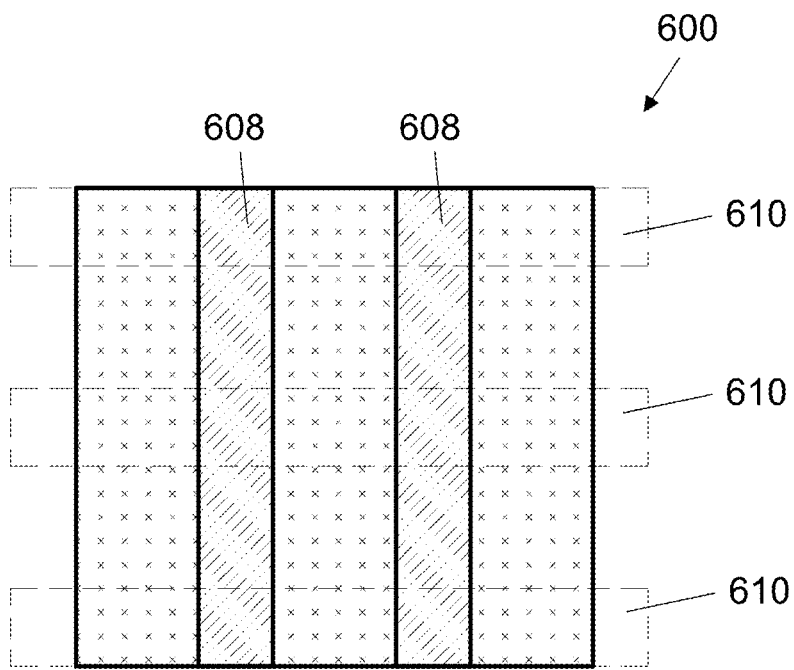

In an example embodiment, a first insulative material deposition process may be performed so as to fill the removed portions outside of the identified bit line locations 608, as illustrated in FIG. 10D.

Figure 10E:
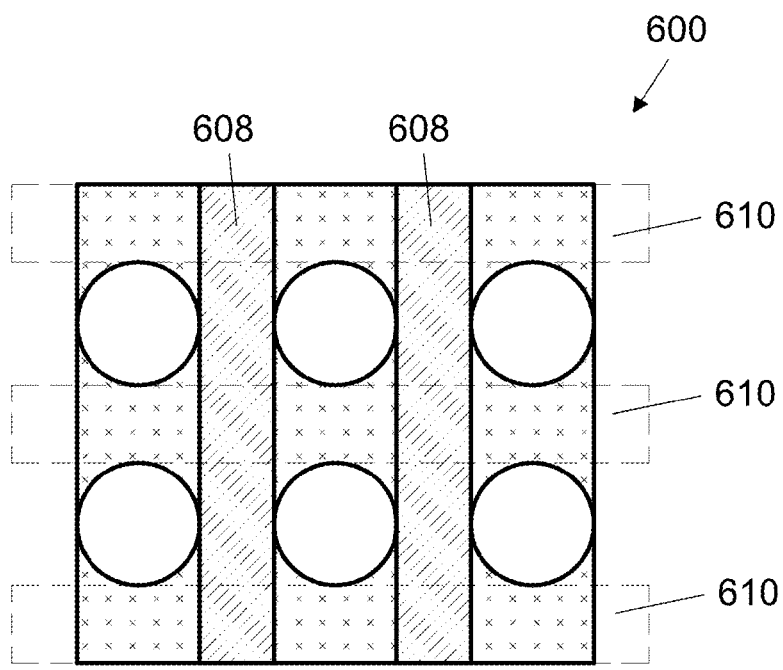

One or more portions of the first insulative material deposited outside of the identified bit line locations 608 may be removed 613' in selected portions (or areas) that are adjacent to the identified bit line locations 608 and within identified word line locations 610, such as the one or more of the portions 613' illustrated in the top view illustrations of FIG. 10E. Each of the removed portions 613' of the first insulative material may be portions extending through the first conductive material to at least a top surface of the substrate 602. For example, the removed portions 612' may have a diameter of about 5-80 nm. In example embodiments, a portion (or side) of the removed portion 612' may be formed within a portion (or side) of an identified bit line location 608. Furthermore, a cross-section of the removed portions may be one or more of a plurality of shapes, including a circle, oval, square, rectangle, triangle, etc.

Figure 10F:
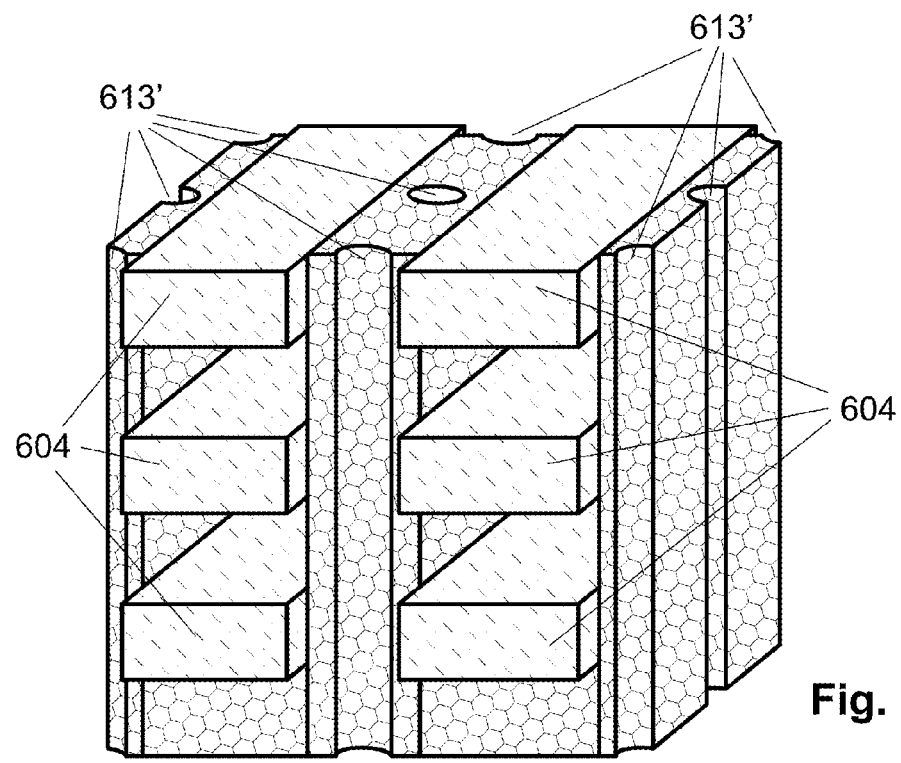

Thereafter, an isotropic etching process may be performed so as to remove the second insulative material from the second insulative material layers 608 within the identified bit line locations 608. Specifically, the second insulative material is removed from the second insulative material layers 606 in the identified bit line locations 608. In this regard, the remaining first insulative material within the identified bit line locations 608 may be supported and held in place by the remaining first insulative material remaining after forming the removed portions 613', and therefore remain "floating" or "suspended" in place in the first insulative material layers 604, as illustrated in FIG. 10F.

A rounding process may then be performed on the remaining first insulative material layers 604 so as to shape the first insulative material layers 604 into a more rounded cross-section (or more cylindrical in shape).

Figure 10G:
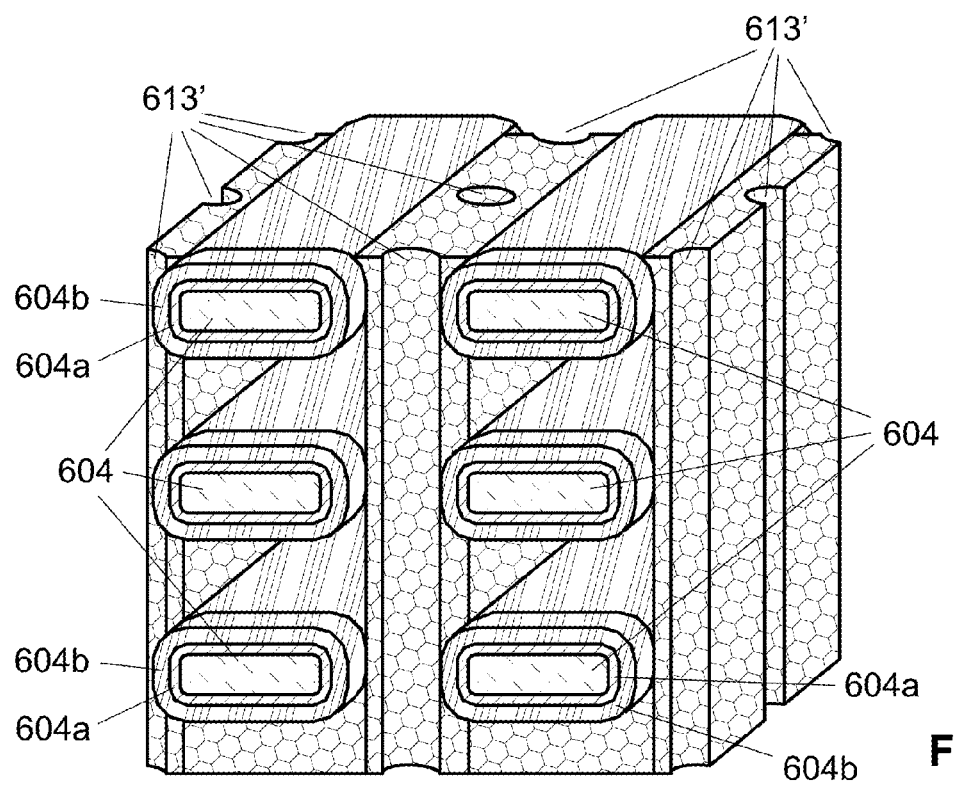

With the rounded first insulative material layers 604', a macaroni deposition process may be performed by first depositing a thin conductive material layer 604a, such as a polysilicon layer, over the rounded first insulative material layers 604'. Thereafter, a charge storage layer 604b may be formed over the conductive material layer 604a, as illustrated in FIG. 10G. In example embodiments, the charge storage layer 604b may be an oxide nitride oxide (ONO) layer 604b.

Figure 10H:
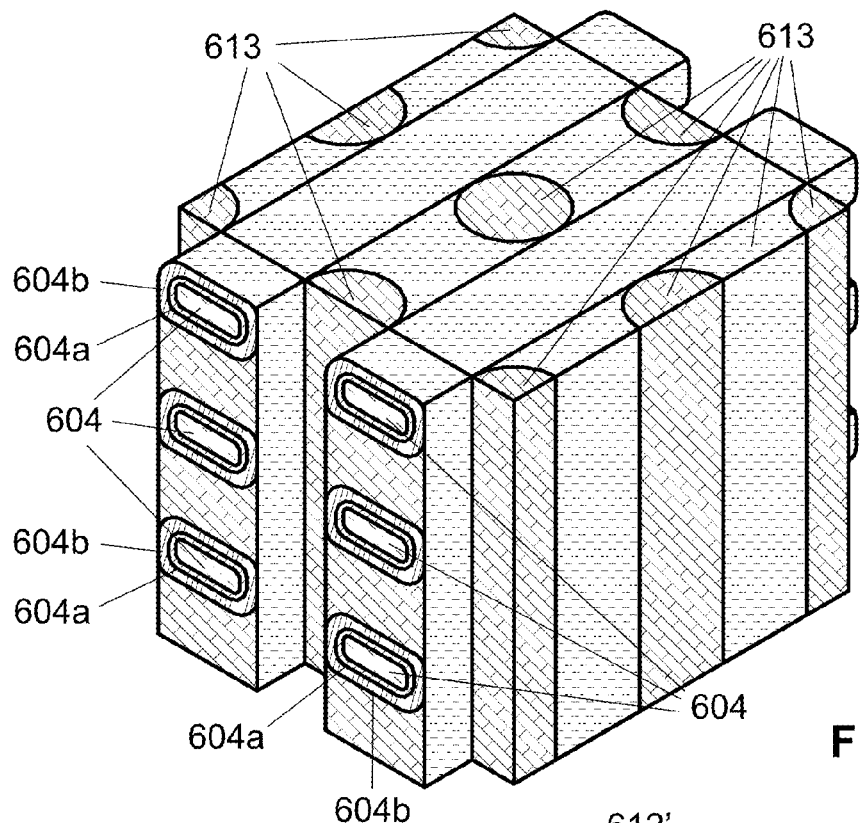

In an example embodiment, a conductive material deposition process may be performed in the removed portions 613', as illustrated in FIG. 10H. In doing so, it is recognized in the present disclosure that conductive material may also be deposited within the removed second insulative material layers 606 within the identified bit line locations 608 and/or identified word line locations 610.

Figure 10I:
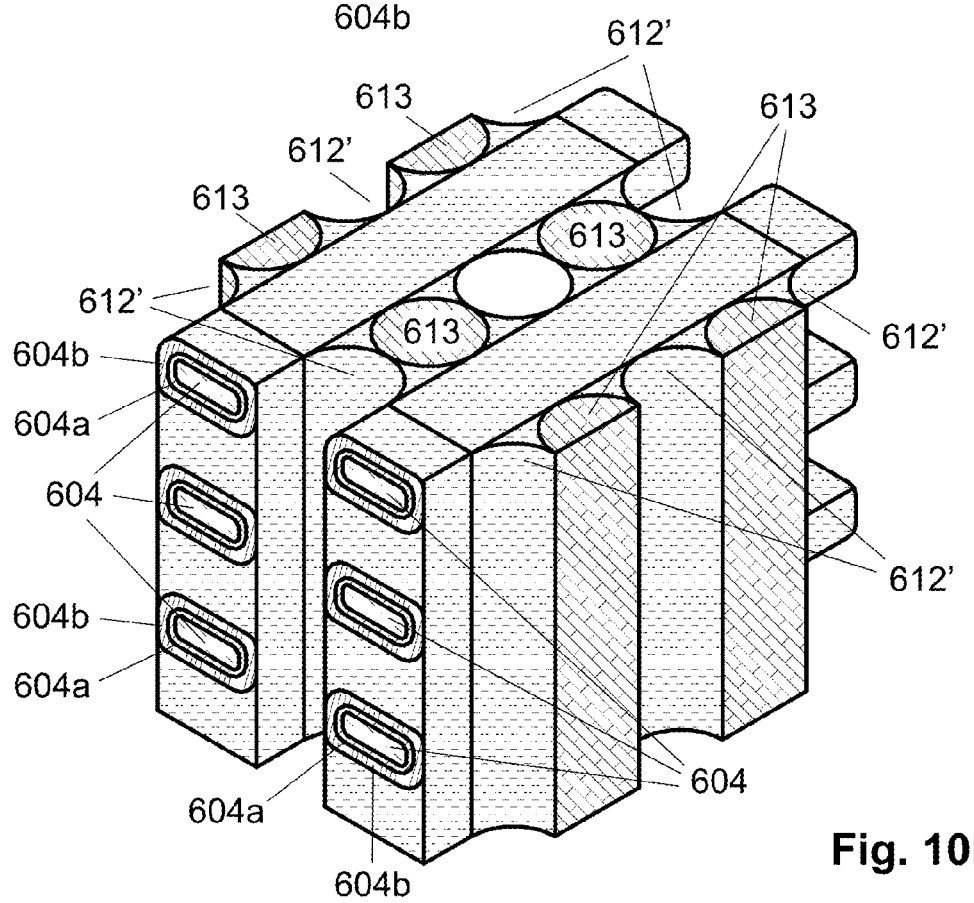

One or more portions of the first insulative material deposited outside of the identified bit line locations 608 may be removed 612' in selected portions (or areas) that are adjacent to the identified bit line locations 608 and identified word line locations 610, such as one or more of the portions 612' illustrated in the top view illustrations of FIG. 10I.

Figure 10J:
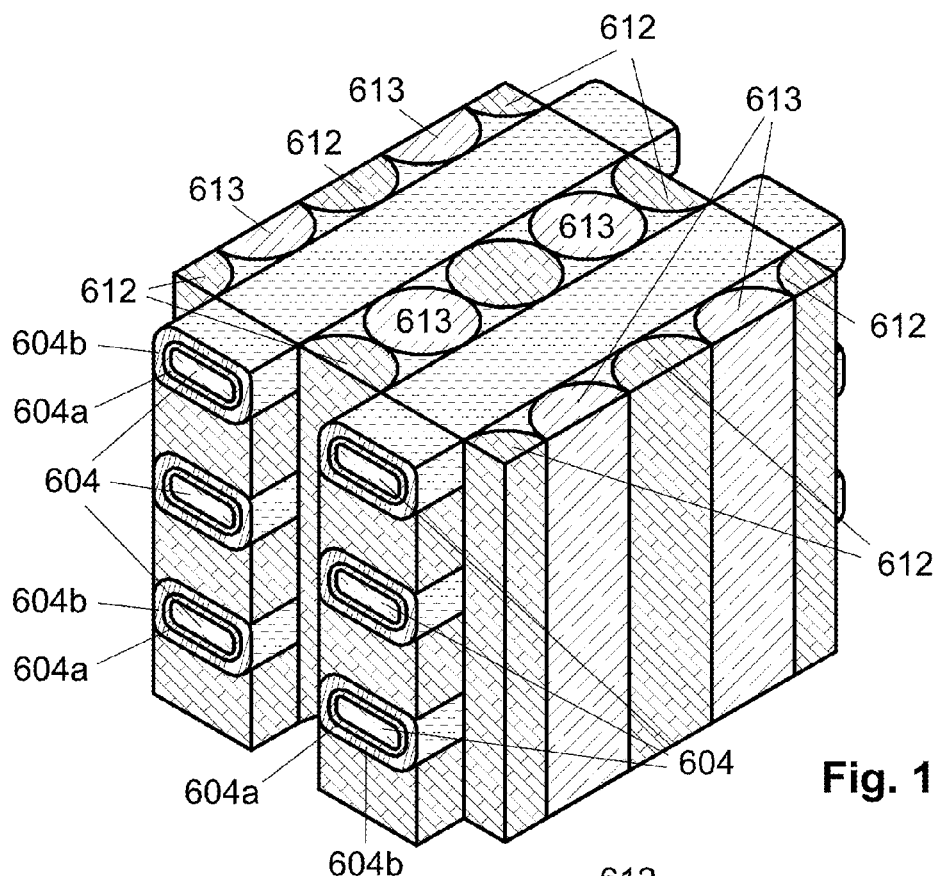

An asymmetrical etching process may then be performed to remove conductive material deposited within the removed second insulative material layers 606 in areas within the identified bit line locations 608 that are outside of the identified word line locations 610, as illustrated in FIG. 10J.

Figure 10K:
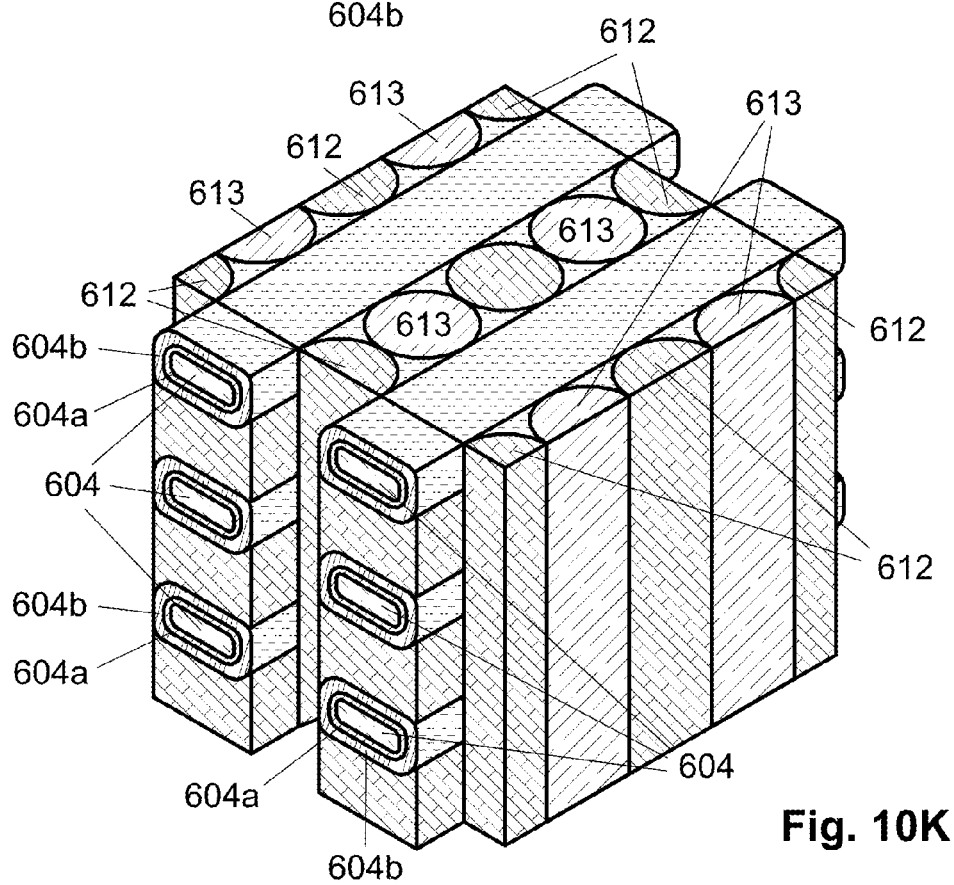

In an example embodiment, as illustrated in FIG. 10K, a first insulative material deposition process may then be performed so as to fill the previously removed portions, including forming vertical first insulative material structures 612. One or more word lines may then be formed for the semiconductor device in the identified word line locations.

It is to be understood in the present disclosure that the charge storage structure may include oxide-nitride-oxide, silicon-oxide-nitride-oxide-silicon (SONOS), or BE-SONOS structures, including those comprising a tunneling dielectric layer, a trapping layer, and a blocking oxide layer. The tunneling dielectric layer may comprise oxide, nitride, and oxide sub-layers and/or a composite of materials forming an inverted "U" shaped valence band under zero bias voltage; the trapping layer may comprise nitride; and the blocking oxide or gate layer may comprise oxide. The tunneling dielectric layer may further include a hole tunneling layer, a band offset layer, and an isolation layer. Other internal structures are also contemplated in this disclosure, including those for floating gate memory, charge trapping memory, NAND-type devices, semiconductor devices other than NAND-type devices, non-volatile memory devices, and/or embedded memory devices.

While various embodiments in accordance with the disclosed principles have been described above, it should be understood that they have been presented by way of example only, and are not limiting. Thus, the breadth and scope of the example embodiments described in the present disclosure should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

For example, as referred to in the present disclosure, "forming" a layer, plurality of layers, plurality of alternating layers, multilayer, stack, and/or structure may include any method of creating the layer, multilayer, and/or structure, including depositing and the like. A "multilayer" may be one layer, structure, and/or stack comprising a plurality of internal layers and/or a plurality of layers, multilayers, structures, and/or stacks stacked or formed on or over one another. Internal structures may include any internal structure of a semiconductor device, including charge storage structures such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer.

Although one or more layers, multilayers, and/or structures may be described in the present disclosure as being "silicon," "polysilicon," "conductive," "oxide," and/or "insulative" layers, multilayers, and/or structures, it is to be understood that example embodiments may be applied for other materials and/or compositions of the layers, multilayers, and/or structures. Furthermore, such structures may be in the form of a crystalline structure and/or amorphous structure in example embodiments.

Furthermore, "patterning" of one or more layers, multilayers, and/or structures may include any method of creating a desired pattern on the one or more layers, multilayers, and/or structures, including performing a photolithography process by applying a photoresist mask (not shown) having pre-formed patterns and etching the layers, multilayers, and/or structures according to the pre-formed patterns on the photoresist mask.

"Stringers" formed, deposited, and/or remaining in and/or on material(s), layer(s), structure(s), and/or between materials, layers, and/or structures may include conductive material, insulative material, and materials having openings, bores, gaps, voids, cracks, holes, bubbles, and the like, and/or a mixture thereof. Furthermore, although the present disclosure describes example embodiments for addressing "stringers," the claimed approaches described in the present disclosure may also be beneficially applicable to address and/or improve other performance-related problems and/or issues, including formation, shifting, changing in size, changing in shape, changing in composition, combining, dividing, and/or migrating of other types of imperfections in the semiconductor fabrication process.

"Elongated posts" or "posts" may be formed, filled, constructed, deposited, and/or structured using one or more of a plurality of materials, including insulative materials, conductive materials, nitrides, and the like, and a cross-section of the elongated posts may be formed in one or more of a plurality of shapes, including a circle, an oval, a square, a rectangle, a triangle, and/or a combination of geometric shapes.

It is to be understood in the present disclosure that the principles described can be applied outside the context of NAND-type devices described in exemplary embodiments, including NOR-type devices, other memory storage devices, floating gate memory devices, charge trapping memory devices, non-volatile memory devices, and/or embedded memory devices.

Various terms used herein have special meanings within the present technical field. Whether a particular term should be construed as such a "term of art" depends on the context in which that term is used. "Connected to," "forming on," "forming over," or other similar terms should generally be construed broadly to include situations where formations, depositions, and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of fabricating a three-dimensional vertical gate (VG) semiconductor structure, the method comprising:
    providing a substrate;
    forming a plurality of layers over the substrate, the plurality of layers having alternating first insulative material layers and second insulative material layers, the first and second insulative material layers formed by a deposition of first insulative material and second insulative material, respectively;
    identifying bit line and word line locations for the formation of bit lines and word lines;
    removing at least a portion of the plurality of layers outside of the identified bit line and word line locations, each of the removed portions extending through the plurality of layers to at least a top surface of the substrate;
    forming a vertical first insulative material structure in the removed portions;
    performing an isotropic etching process to remove the second insulative material from the second insulative material layers;
    forming bit lines in the second insulative material layers within the identified bit line locations; and
    forming word lines in the identified word line locations;
    wherein the vertical first insulative material structures are operable to provide support for the first insulative material layers remaining after the removing of the second insulative material from the second insulative material layers.

2. The method of claim 1, wherein each of the removed portions of the plurality of layers resembles a hole in the plurality of layers.

3. The method of claim 2, wherein each of the vertical first insulative material structures are formed by a deposition of first insulative material in the holes.

4. The method of claim 3, further comprising removing remaining portions of the plurality of layers outside of the identified bit line locations.

5. The method of claim 1, wherein the forming the bit lines comprises:
    rounding each of the first insulative material layers remaining after the removal of the second insulative material from the second insulative material layers; and
    forming, within the identified bit line locations, a thin conductive layer over each of the first insulative material layers remaining after the removing the second insulative material from the second insulative material layers.

6. The method of claim 5, wherein the forming the bit lines further comprises forming a charge storage layer over each of the thin conductive layers.

7. The method of claim 6, wherein the charge storage layer is an oxide-nitride-oxide layer.

8. The method of claim 4, wherein the forming the word lines comprises a deposition of conductive material in at least the removed remaining portions of the plurality of layers that are outside of the identified bit line locations and within the identified word line locations.

9. The method of claim 8, further comprising re-forming the holes by removing the first insulative material from the vertical first insulative material structures.

10. The method of claim 9, further comprising performing an asymmetrical etching process to remove any deposited conductive material deposited outside of the identified word line locations.

11. The method of claim 10, further comprising depositing first insulative material in the re-formed holes.

12. The method of claim 1, wherein the removed portions of the plurality of layers includes all portions of the plurality of layers that are outside of the identified bit line locations.

13. The method of claim 12, wherein the forming the vertical first insulative material structures comprises:
    a deposition of first insulative material in the removed portions of the plurality of layers; and
    forming a hole in identified word line locations outside of the identified bit line locations.

14. The method of claim 13, wherein the forming the word lines comprises depositing conductive material in at least the holes.

15. The method of claim 14, further comprising forming holes in the first insulative material deposited outside of the identified bit line and word line locations.

16. The method of claim 15, further comprising performing an asymmetrical etching process to remove any deposited conductive material deposited outside of the identified word line locations.

17. The method of claim 10, further comprising depositing first insulative material in the holes.

18. The method of claim 1, wherein the first insulative material is an oxide material and the second insulative material is a nitride material.

19. A semiconductor device formed by the method of claim 1.

20. A semiconductor structure comprising:
a three-dimensional vertical gate (VG) structure having bit lines and word lines formed over a substrate; and
a plurality of elongated posts extending from at least a top surface of the substrate, the plurality of elongated posts formed adjacent to the three-dimensional vertical gate structure and operable to provide support for the three-dimensional vertical gate structure;
wherein the bit lines are formed by:
forming a plurality of layers over the substrate, the plurality of layers having alternating first insulative material layers and second insulative material layers, the first and second insulative material layers formed by a deposition of first insulative material and second insulative material, respectively;
identifying bit line and word line locations for the formation of the bit lines and word lines; and
performing an isotropic etching process to remove the second insulative material from the second insulative material layers.

21. The semiconductor structure of claim 20, further comprising:
removing at least a portion of the plurality of layers outside of the identified bit line and word line locations, each of the removed portions extending through the plurality of layers to at least a top surface of the substrate; and
forming a vertical first insulative material structure in the removed portions.

22. A semiconductor structure, comprising:
a three-dimensional vertical gate (VG) structure having bit lines and word lines formed over a substrate; and
a plurality of elongated posts extending from at least a top surface of the substrate, the plurality of elongated posts formed adjacent to the three-dimensional vertical gate structure and operable to provide support for the three-dimensional vertical gate structure;
wherein the bit lines comprise:
a plurality of rounded first insulative material layers; and
a thin conductive layer formed over each of the rounded first insulative material layers.

23. The semiconductor structure of claim 22, further comprising a charge storage layer formed over each of the thin conductive layers.

\* \* \* \* \*